(12) United States Patent
Morinari

(10) Patent No.: US 7,407,401 B2
(45) Date of Patent: Aug. 5, 2008

(54) SOCKET FOR ELECTRICAL PARTS

(75) Inventor: Takashi Morinari, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 11/749,421

(22) Filed: May 16, 2007

(65) Prior Publication Data

US 2007/0270015 A1 Nov. 22, 2007

(30) Foreign Application Priority Data

May 18, 2006 (JP) ............................ 2006-138760

(51) Int. Cl.
*H01R 13/62* (2006.01)

(52) U.S. Cl. ...................................... 439/331; 439/266

(58) Field of Classification Search ................ 439/331, 439/266, 71

See application file for complete search history.

(56) References Cited

U.S. PATENT DOCUMENTS

| | | | | |
|---|---|---|---|---|
| 6,162,066 A * | 12/2000 | Glick et al. | ................ | 439/73 |
| 6,193,525 B1 * | 2/2001 | Takayama | ................ | 439/71 |
| 6,283,780 B1 * | 9/2001 | Yamamoto et al. | ................ | 439/266 |
| 6,322,384 B1 * | 11/2001 | Ikeya | ................ | 439/331 |
| 6,368,137 B1 * | 4/2002 | Orwoll | ................ | 439/331 |
| 6,666,691 B2 * | 12/2003 | Ikeya | ................ | 439/71 |
| 6,749,443 B2 * | 6/2004 | Sano et al. | ................ | 439/71 |
| 6,752,645 B2 * | 6/2004 | Nakamura et al. | ................ | 439/330 |
| 6,758,684 B2 * | 7/2004 | Oikawa et al. | ................ | 439/73 |
| 6,767,236 B2 * | 7/2004 | Azumi | ................ | 439/331 |
| 6,776,641 B2 * | 8/2004 | Hachuda | ................ | 439/331 |
| 6,848,928 B2 * | 2/2005 | Ikeya et al. | ................ | 439/331 |
| 6,863,553 B2 * | 3/2005 | Watanabe | ................ | 439/330 |
| 6,902,424 B2 * | 6/2005 | Takayama et al. | ................ | 439/487 |
| 7,204,708 B2 * | 4/2007 | Sato et al. | ................ | 439/259 |
| 7,247,042 B2 * | 7/2007 | Matsuo et al. | ................ | 439/330 |
| 7,287,997 B2 * | 10/2007 | Matsuo et al. | ................ | 439/330 |
| 2003/0114034 A1 * | 6/2003 | Sano et al. | ................ | 439/331 |
| 2004/0014346 A1 * | 1/2004 | Azumi | ................ | 439/266 |
| 2004/0018762 A1 * | 1/2004 | Takayama et al. | ................ | 439/266 |
| 2004/0029412 A1 * | 2/2004 | Hachuda et al. | ................ | 439/66 |
| 2005/0250363 A1 * | 11/2005 | Suzuki et al. | ................ | 439/266 |

FOREIGN PATENT DOCUMENTS

JP 11-162602 6/1999

OTHER PUBLICATIONS

U.K. Intellectual Property Office Search Report dated Sep. 7, 2007 for corresponding U.K. Patent Application No. 0709444.4.

* cited by examiner

*Primary Examiner*—Ross N Gushi
(74) *Attorney, Agent, or Firm*—Staas & Halsey LLP

(57) ABSTRACT

A socket for an electrical part includes a pressing member mounted to the socket body accommodating an electrical part to be rotatable and configured to press the electrical part in a horizontal position thereof, an operation member provided for the socket body to be vertically movable and configured to rotate the pressing member, and a latch member provided having an engaging pawl to be engaged with the socket body in the horizontal state of the pressing member. The latch member is provided with a pressed portion, and when the operation member is moved downward in a state that the latch member is engaged with the socket body, an engagement releasing member formed to the operation member presses the pressed portion to rotate the latch member so as to release the engagement of the latch member with the socket body.

6 Claims, 34 Drawing Sheets

SOCKET FOR ELECTRICAL PARTS

CROSS REFERENCE TO RELATED APPLICATIONS

This application is based on and claims priority to Japanese Application No. 2006-138760, filed on May 18, 2006, the disclosure of which is hereby incorporated herein by reference.

BACKGROUND OF THE INVENTION

1. Field of the Invention

The present invention relates to a socket for an electrical part such as semiconductor device (called "IC package" hereinlater) for detachably holding the electrical part.

2. Related Art

As a conventional socket for an electrical part of this kind, there is known a socket for holding an IC package as electrical part for carrying out a performance test such as a burn-in test with respect to the IC package as disclosed in Patent Document 1 (Japanese Unexamined Patent Publication No. 11-162602 A).

In such socket for the electrical part, the IC package is accommodated in a socket body, a pressing member provided for a support member is rotated so as to take a horizontal position, a latch member provided for the socket body is engaged with the pressing member so as to press the IC package accommodated in the socket body from the upper side thereof, and a number of electrodes are pressed at a predetermined pressure against electrically conductive portions formed to the socket body.

In such conventional structure, although the latch member is engaged with the pressing member to thereby maintain the closed state of the pressing member, a mechanism for engaging or disengaging the latch member with or from the pressing member has a complicated structure, thus increasing the number of elements or parts and making instable an operation of the device.

SUMMARY OF THE INVENTION

The present invention was conceived in consideration of the above circumstances encountered in the prior art mentioned above and an object thereof is to provide a socket for an electrical part including a simple mechanism for engaging a pressing member in a closed state thereof.

This and other objects of the present invention can be achieved according to the present invention by providing a socket for an electrical part comprising:

a socket body accommodating an electrical part;

an electrically conductive member disposed to the socket body and configured to contact to a terminal of the electrical part so as to establish an electric conduction therebetween;

a pressing member mounted to the socket body to be rotatable and configured to press the electrical part in a horizontal position thereof;

an operation member provided for the socket body to be vertically movable and configured to rotate the pressing member; and a latch member provided for the pressing member to be rotatable and having an engaging portion to be engaged with the socket body in the horizontal state of the pressing member, the latch member being provided with a pressed portion, and when the operation member is moved downward in a state that the latch member is engaged with the socket body, and an engagement releasing member formed to the operation member presses the pressed portion to rotate the latch member so as to release the engagement of the latch member with the socket body.

According to this aspect of the present invention, the latch member is rotatably mounted to the pressing member, and only the engagement releasing member for releasing the engagement of the latch member is formed to the operation member. Accordingly, the engaging mechanism at the time the pressing member is closed can be provided with a simple structure.

In a preferred embodiment, a pair of pressing members may be disposed so as to be opened outward, the pressing member has a base end side which is provided for the socket body to be rotatable around a rotation shaft, and the latch member is mounted to a front end of the pressing member to be rotatable.

According to this feature, even if the paired pressing members have a large size (i.e., large electrical part), the front end portion of the pressing member does not float, and hence, the upper surface of the electrical part can be surely uniformly depressed.

Furthermore, it may be desired that the socket body is provided with a support member to be vertically movable, the pressing member is mounted to the support member to be rotatable, the support member is connected to the operation member through a link member so that when the operation member is moved downward, the support member is moved upward through an operation of the link member and the engagement of the latch member is released by the engagement releasing member to thereby rotate the pressing member to be opened, and when the operation member is moved upward, the pressing member is rotated to be closed in a horizontal state, the latch member is engaged with the support member, the support member being moved downward through the link member so that the pressing member is moved downward parallelly to press the electrical part.

According to this feature, the front end portion of the pressing member fixed to the support member by the latch member is moved downward parallelly, so that the upper surface of the electrical part can be surely pressed with the extremely horizontal state being maintained.

The latch member may include a pair of latch pieces connected with each other through a connection portion, each of the latch pieces is formed with the pressed portion and the engaging portion, the pressing member has a substantially rectangular shape, and the latch pieces are disposed on both end side portions of the front end side of the pressing member.

According to this feature, the pressing member can be more surely engaged, and in addition, since the paired latch pieces are integrated by the connection portion, the number of parts can be eliminated and the handling working may be made easy.

It may be further desirable that the socket is an IC socket and the electrical part is an IC package.

The nature and further characteristic features of the present invention will be made clearer from the following descriptions made with reference to the accompanying drawings.

BRIEF DESCRIPTION OF THE DRAWINGS

In the accompanying drawings:

FIG. 34A and FIG. 34B are views showing the IC package, in which FIG. 34A is a front view of the IC package and FIG. 34B is a bottom view thereof.

DESCRIPTION OF THE PREFERRED EMBODIMENT

Figure 1:
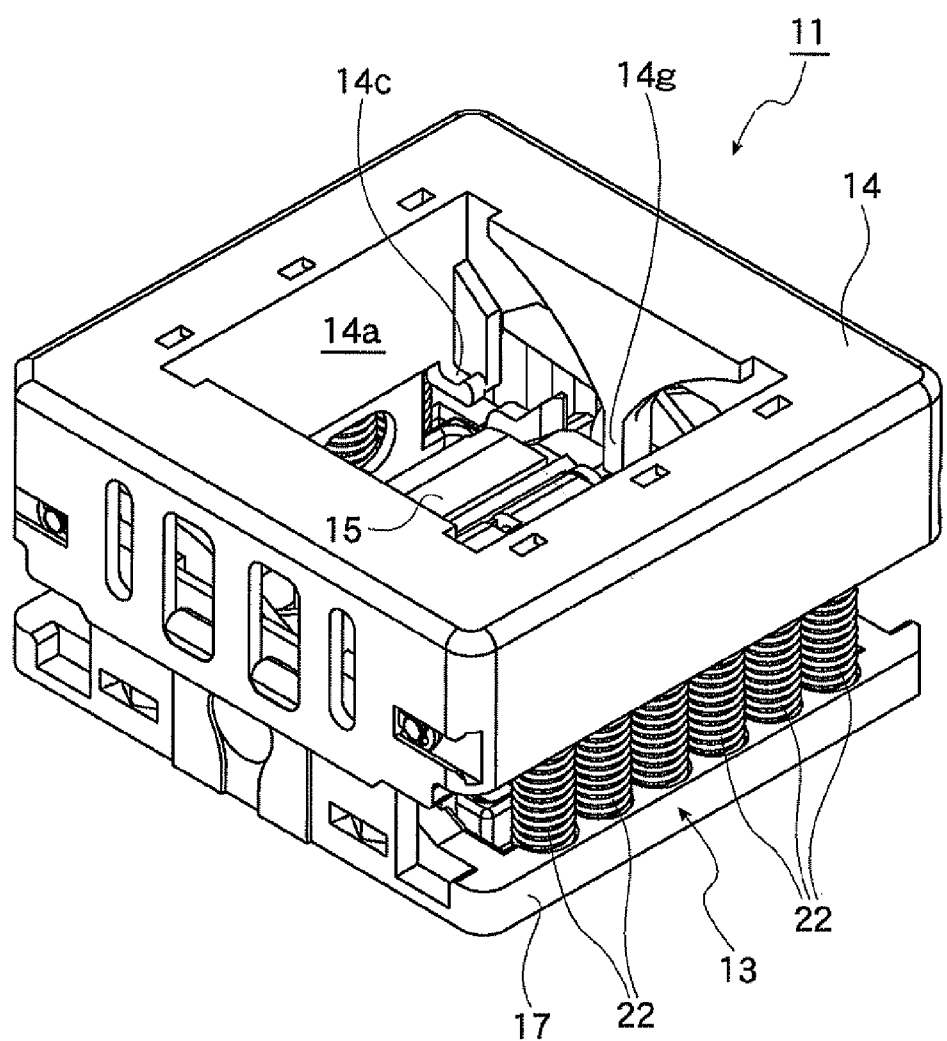
FIG. 1 is a perspective view showing an IC socket according to one embodiment of the present invention.

Preferred embodiments of the present invention will be described hereunder with reference to FIG. 1 to FIG. 34B. Further, it is to be noted that terms of "upper", "lower", "right", "left" and like terms are used herein with reference to the illustration of the drawings or in an actually using state of a socket for an electrical part.

With reference to these figures, reference numeral 11 denotes an IC socket as a "socket for an electrical part", and the IC socket 11 is a member electrically connecting a terminal 12b of an IC package 12 as an "electrical part" to a printed circuit board, not shown, of a tester for carrying out a performance test of the IC package 12.

Figure 34A:
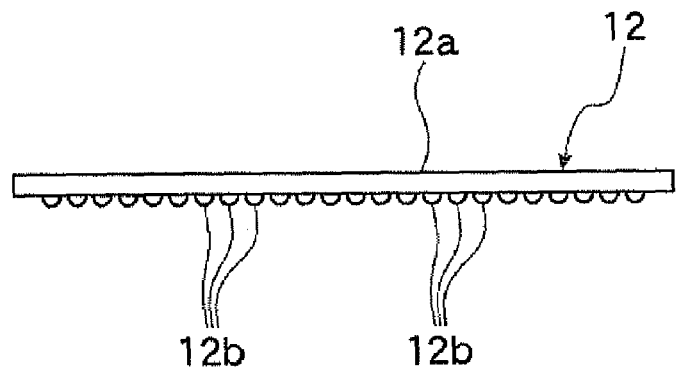
Figure 34B:
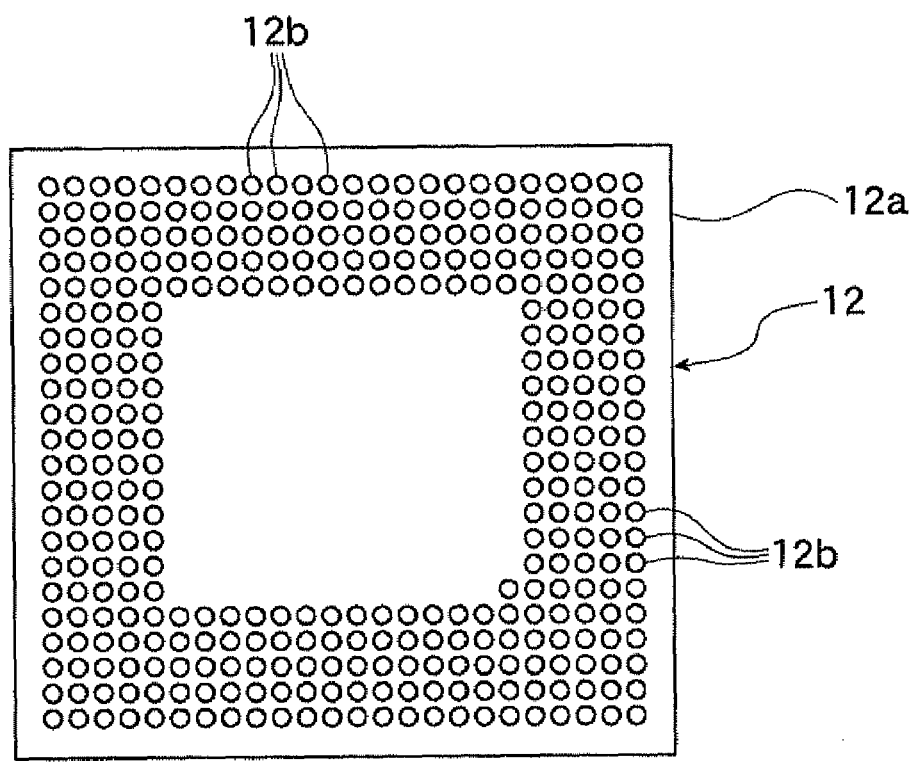

As shown in FIGS. 34A and 34B, the IC package 12 has a square-shaped package body 12a, and a number of terminals 12b, each having a semi-spherical shape, arranged to a bottom surface of the package body 12a.

On the other hand, the IC socket 11 has a socket body 13 which is mounted on a printed circuit board, and the IC package 12 is accommodated on this socket body 13. An operation member 14 is disposed to the socket body 13 to be vertically movable, and when the operation member 14 is moved downward (lowered), a pair of pressing members 15 pressing the IC package 12 are opened outward, and on the other hand, when the operation member is moved upward (raised), the pressing members 15 are closed. In such closed state, the paired pressing members 15 are fixed by means of latch members 16, respectively.

Figure 4:
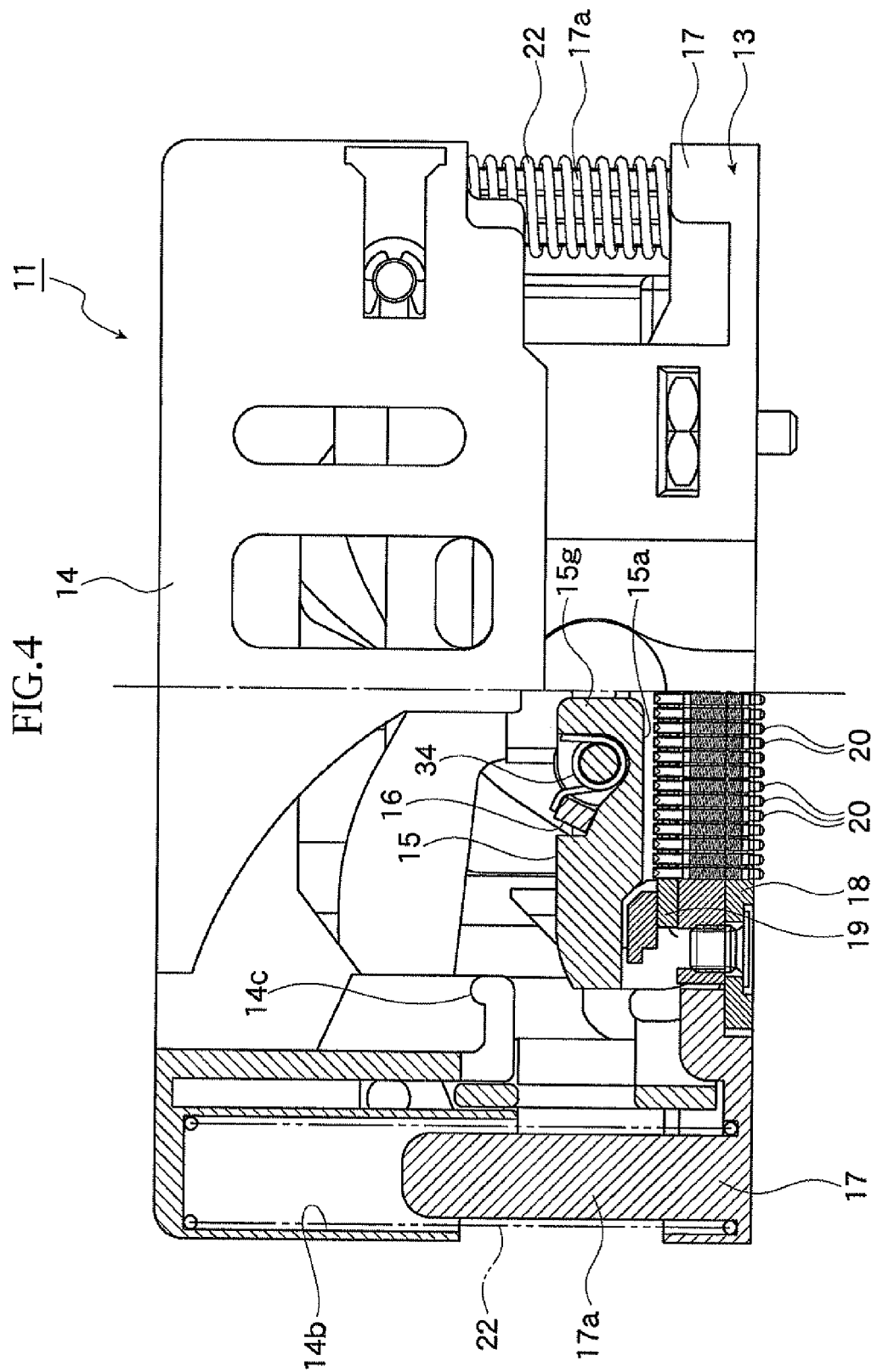
FIG. 4 is a front view, left-half in section, showing a state in which an operation member of the IC socket of the present embodiment is moved upward.
Figure 5:
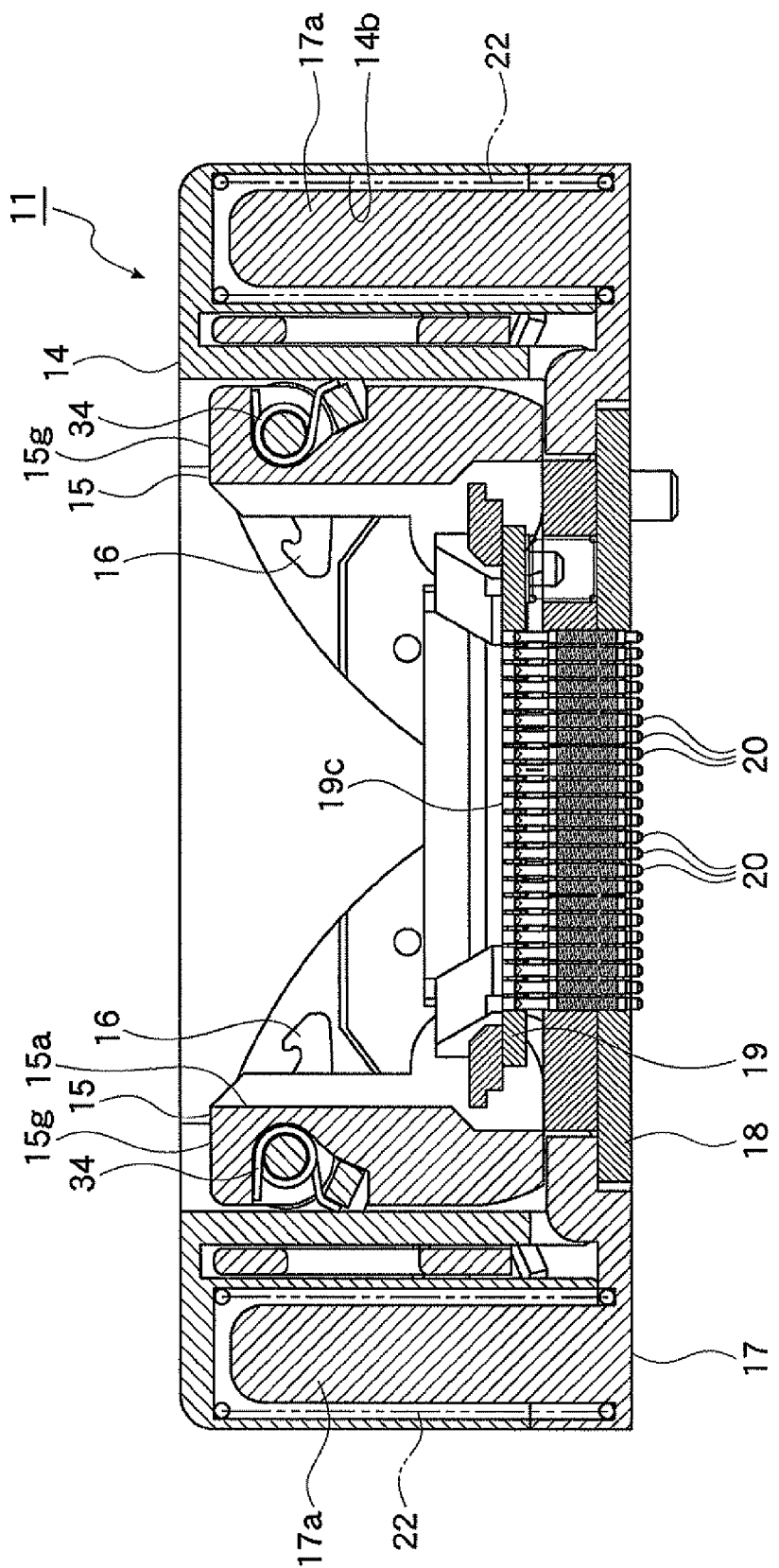
FIG. 5 is a sectional view showing a state in which the operation member of the IC socket is moved downward.
Figure 6:
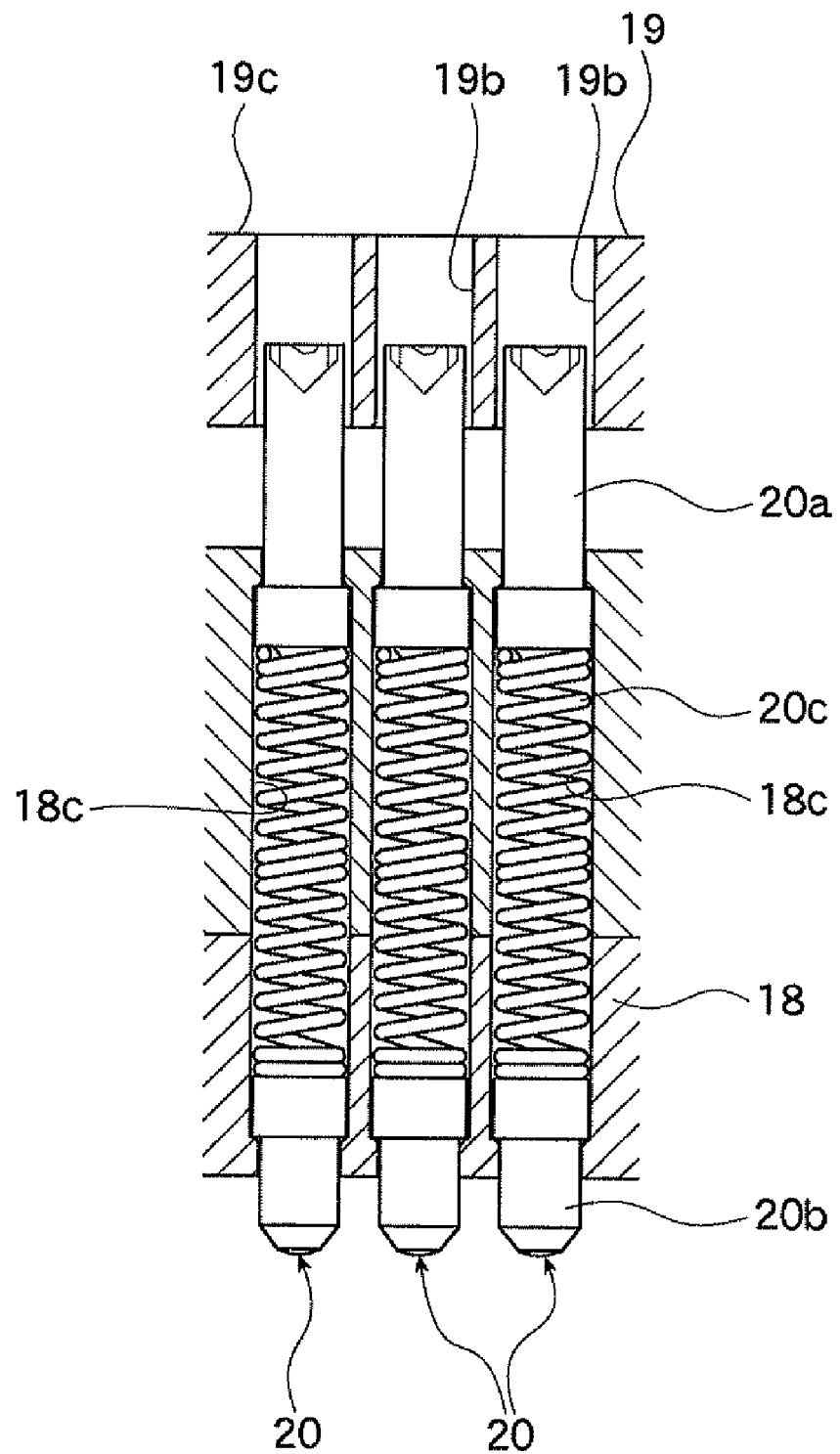
FIG. 6 is a sectional view, in an enlarged scale, showing an arrangement of contact pins according to the present embodiment.
Figure 7:
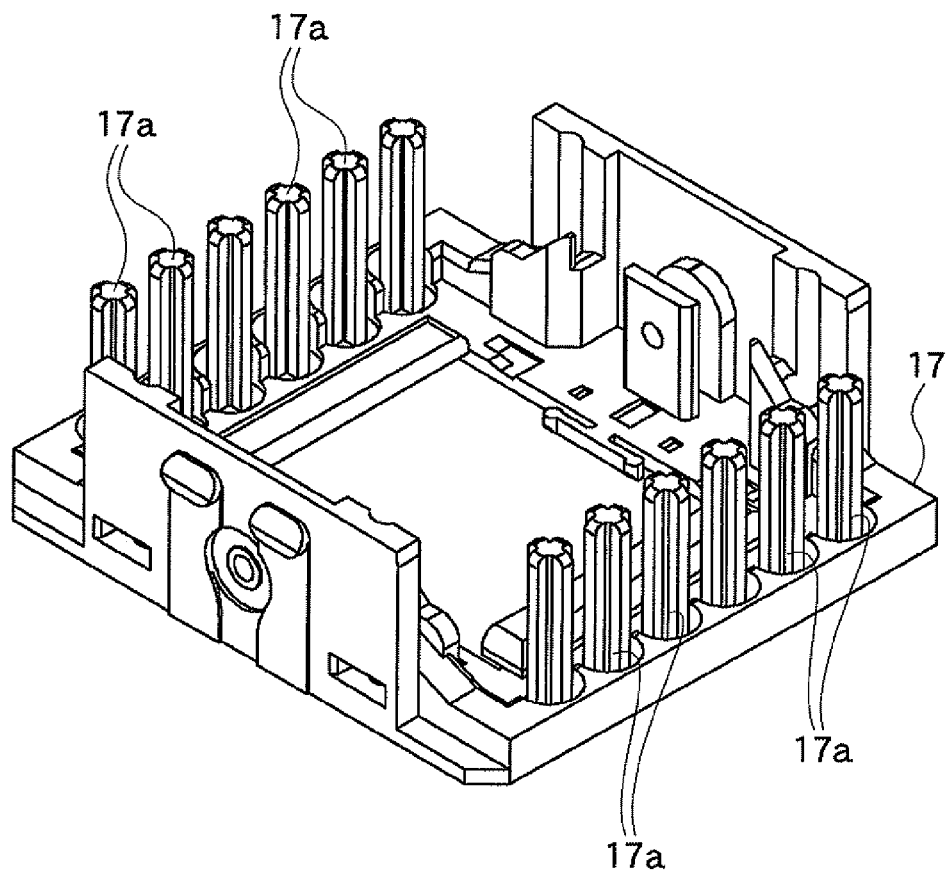
FIG. 7 is a perspective view showing an outer frame of a socket body of the IC socket according to the present embodiment.

More specifically, as shown in FIGS. 4 to 6, the socket body 13 has an outer frame member 17 inside of which a base member 18 is disposed, and a floating plate 19 is disposed above the base member 18. A number of contact pins 20, as "electrically conductive members", are arranged to the floating plate 19 and the base member 18 along the vertical direction thereof.

Figure 8:
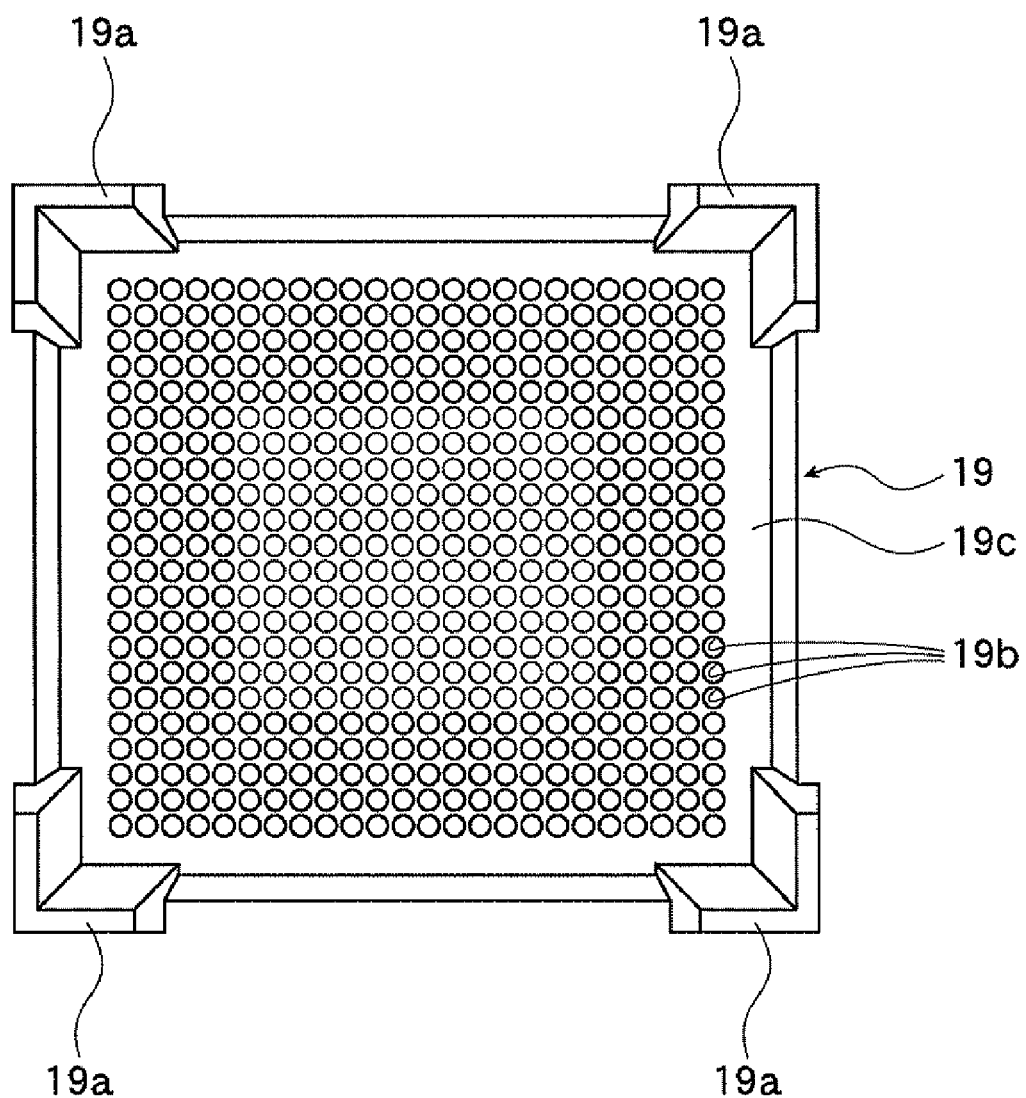
FIG. 8 is a plan view of a floating plate according to the present embodiment.

The floating plate 19 has, as shown in FIG. 8, substantially square shape having four corner portions at which guide portions 19a are disposed so as to extend vertically upward for guiding respective corner portions of the IC package 12. The floating plate 19 is also formed with a number of through holes 19b through which the contact pins 20 are inserted, respectively. And the floating plate 19 is urged upward with respect to the base member 18 by means of a spring, not shown.

Each of the contact pins 20 is made of a conductive metal material, and includes an upper side plunger 20a, a lower side plunger 20b and a coil spring 20c disposed between the upper and lower side plungers 20a and 20b. The contact pin 20 is inserted into an insertion hole 18c formed to the base member 18, and the upper end portion of the upper side plunger 20a is inserted into the through hole 19b of the floating plate 19.

The lower side plunger 20b projects downward through the insertion hole 18c of the base member 18 so as to be contacted under pressure to an electrode portion of the printed circuit board. The upper side plunger 20a abuts, on the other hand, against the terminal 12b of the IC package 12.

Furthermore, the outer frame member 17 is disposed so as to surround the base member 18 so that a peripheral edge portion of the base member 18 is pressed by the outer frame member 17.

Further, the operation member 14 has a rectangular frame shape, and as shown in FIGS. 1, 2, 13 and 14, has an opening 14a having a size capable of inserting the IC package 12, and IC package 12 is then inserted through the opening 14a and accommodated on the floating plate 19 of the socket body 13.

Figure 14:
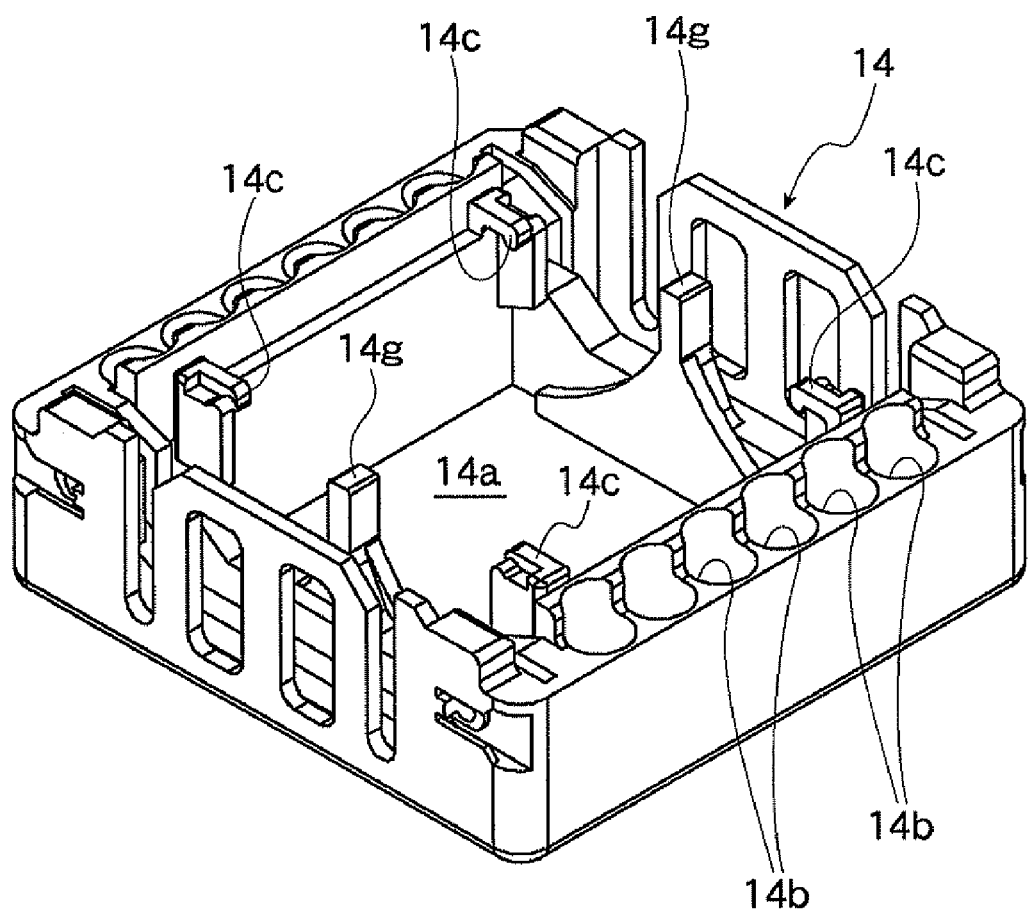
FIG. 14 is a perspective view of the operation member seen from an obliquely back side thereof.
Figure 15:
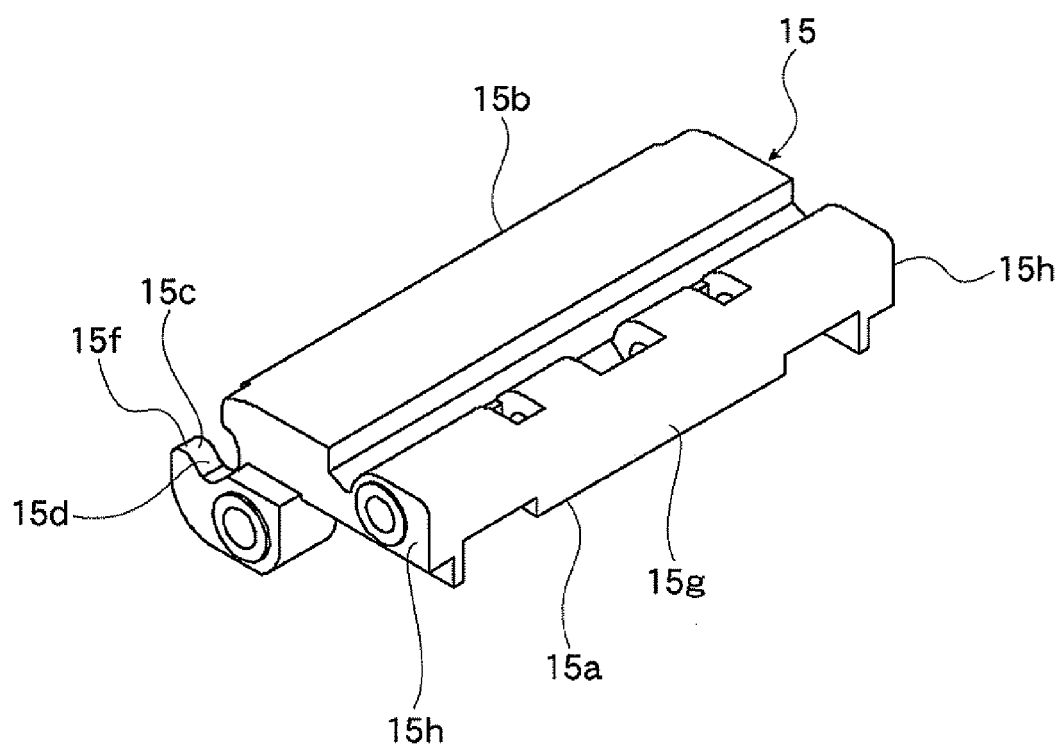
FIG. 15 is a perspective view of a pressing member according to the present embodiment seen from an obliquely upper side thereof.
Figure 16:
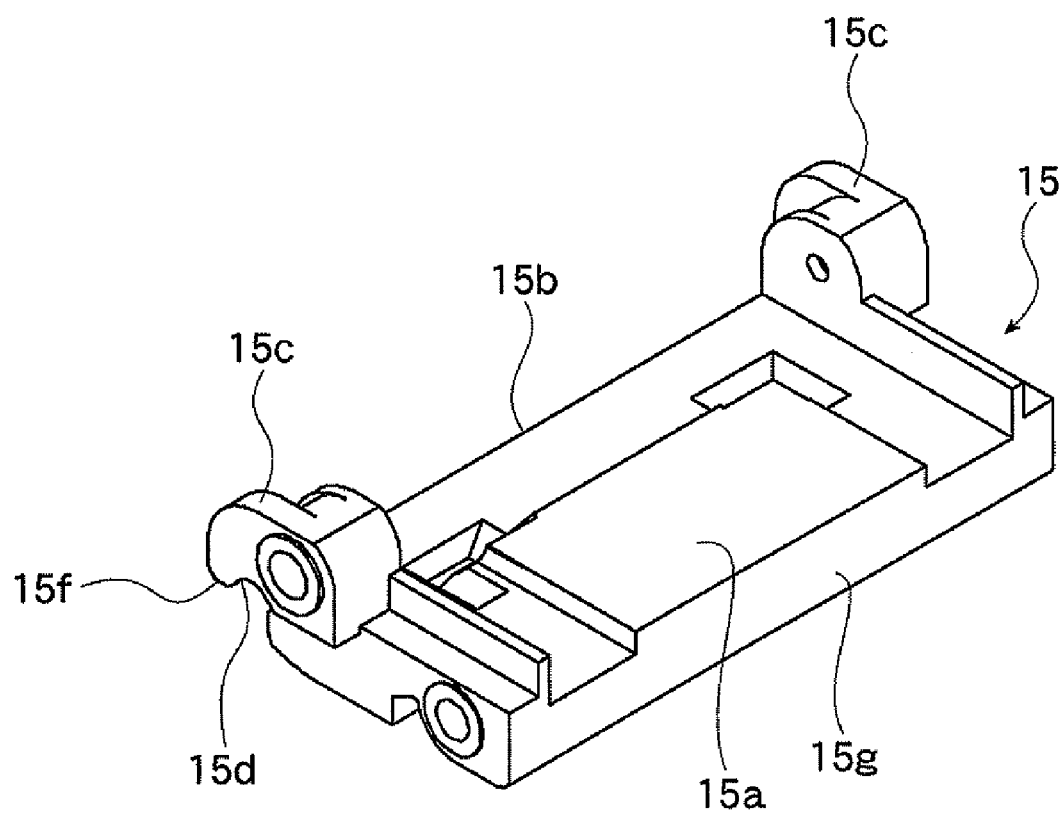
FIG. 16 is a perspective view of a pressing member according to the present embodiment seen from an obliquely back side thereof.

Furthermore, the operation member 14 is, as shown in FIGS. 4, 5 and 14, formed with a plurality of guide holes 14b into which a plurality of guide posts 17a formed to the outer frame member 17 of the socket body 13 are inserted so that the operation member 14 is guided vertically. In each guide hole 14b, a spring 22 is coiled around the guide post so as to upwardly urge the operation member 14.

Figure 12:
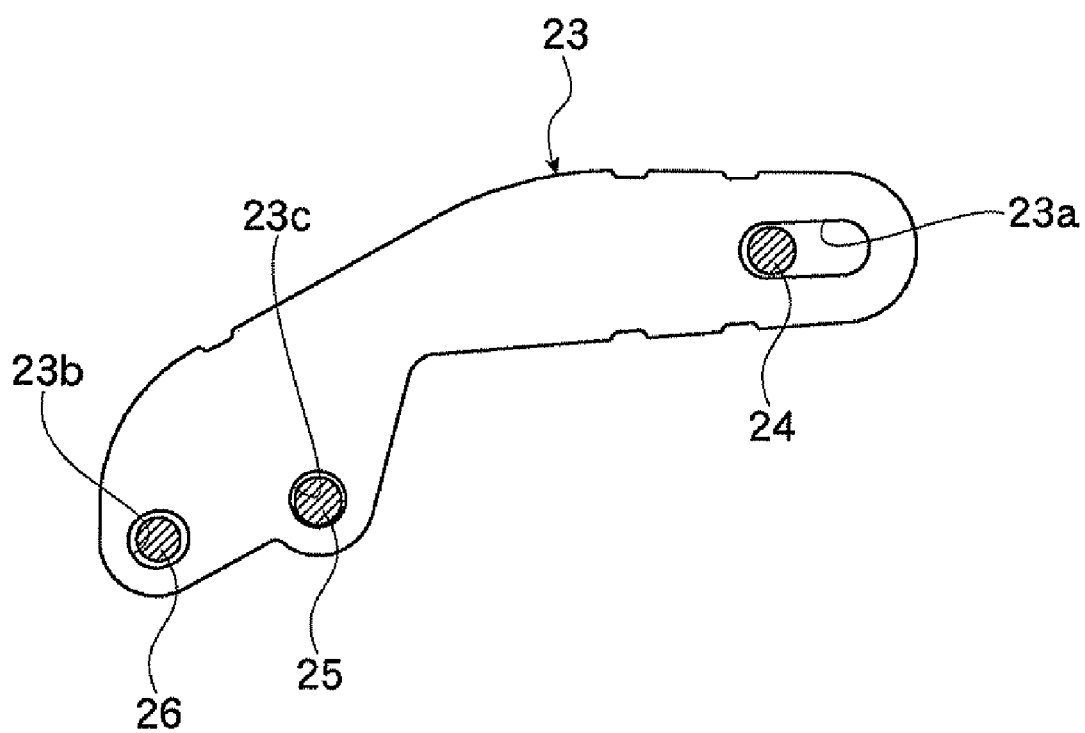
FIG. 12 is a front view of a link member according to the present embodiment.
Figure 13:
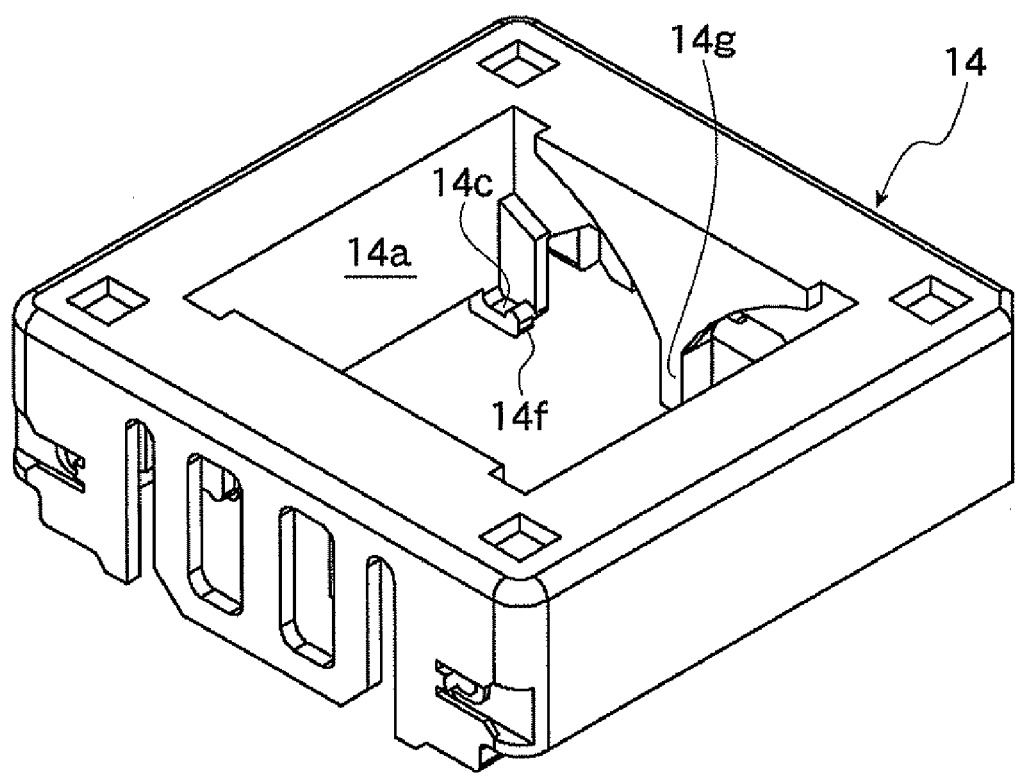
FIG. 13 is a perspective view of the operation member seen from an obliquely upper side thereof.
Figure 20:
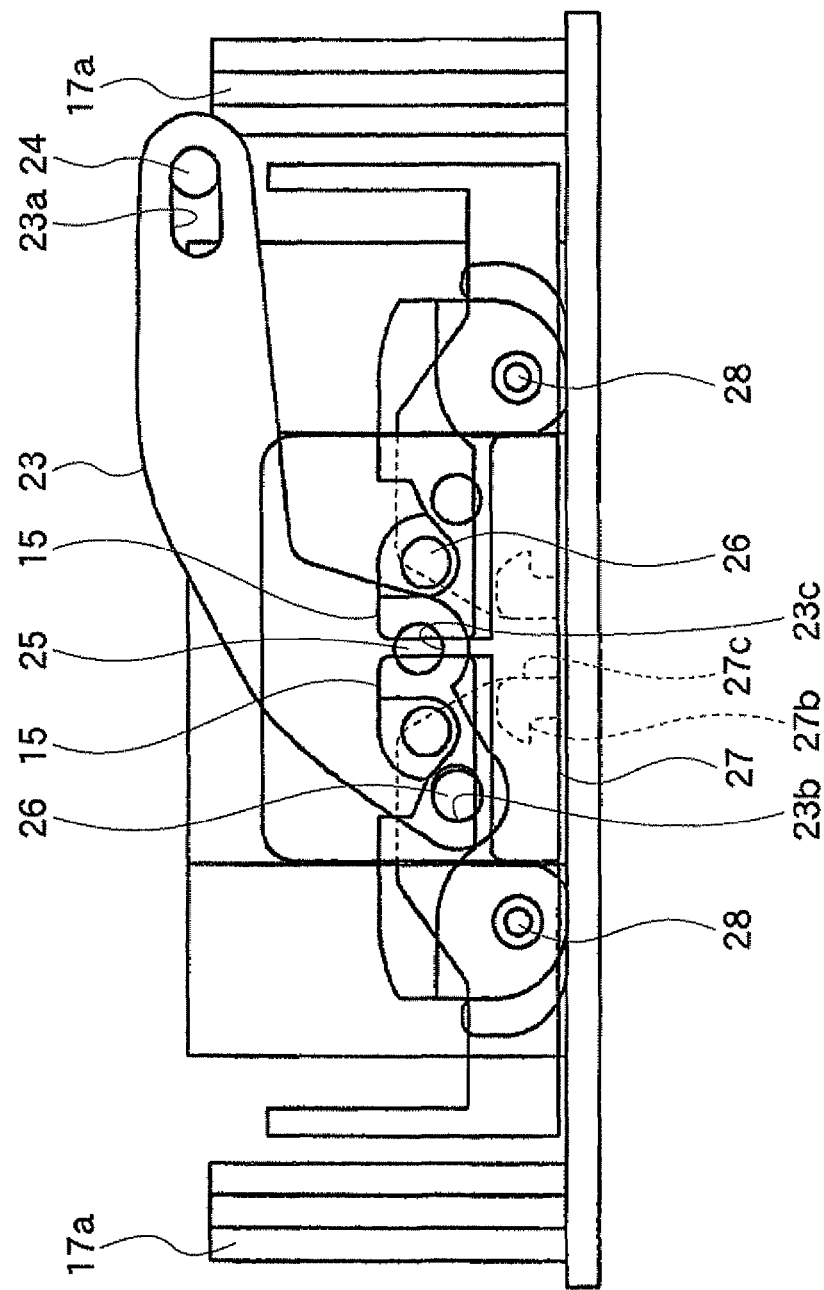
FIG. 20 is a schematic view showing an arrangement of the operation member, the link member, the support member and so on in one position.
Figure 21:
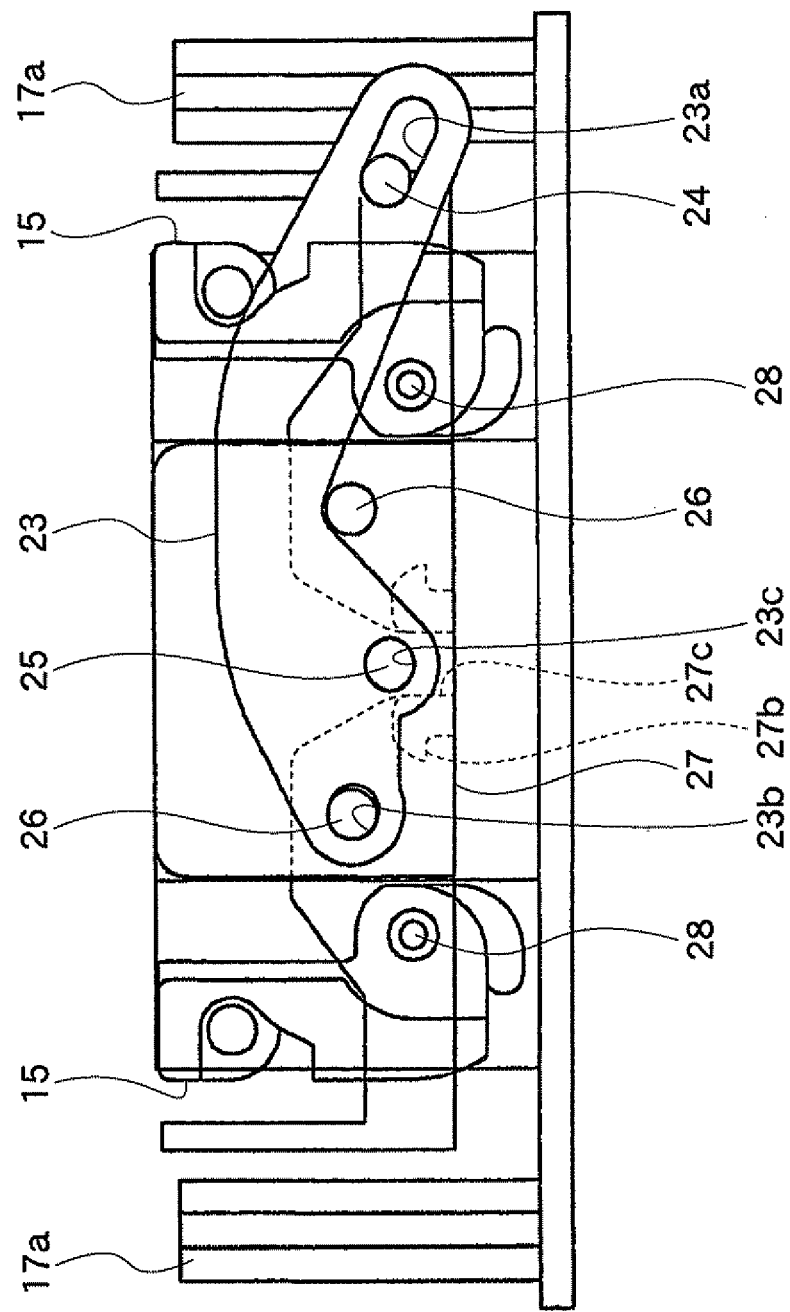
FIG. 21 is a schematic view showing an arrangement of the operation member, the link member, the support member and so on in another position.
Figure 22:
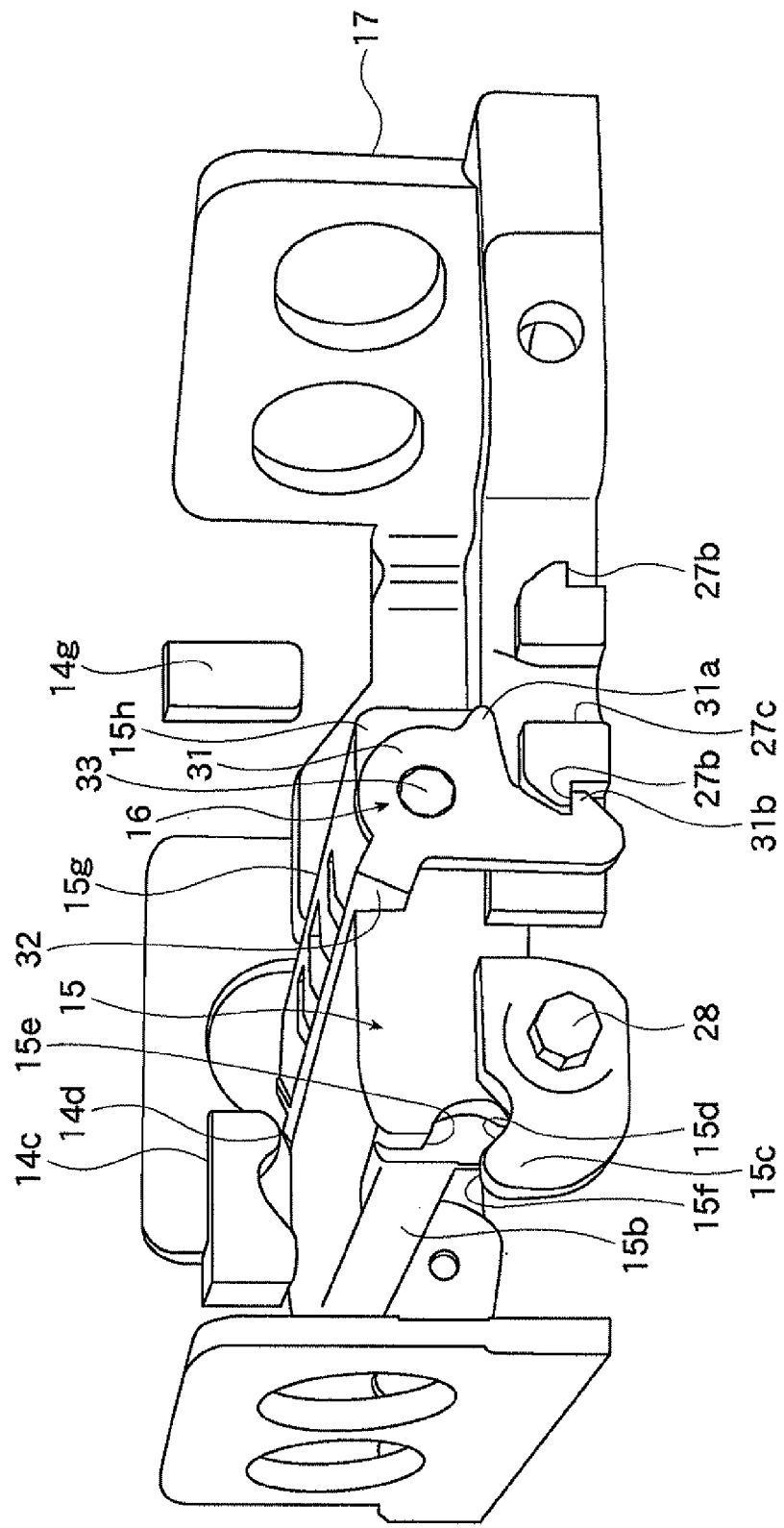
FIG. 22 is a perspective view showing the movement of the pressing member and the latch member in a closed state of the operation member.

Two pairs of, totally four, link members 23 as shown in FIG. 12 are disposed as shown in FIGS. 20 and 21 among the operation member 14, the socket body 13 and a support member 27, mentioned hereinafter.

Each of the link members 23 has a shaft hole 23c formed at an intermediate portion of the link member 23, a slot 23a formed to one end thereof and another hole 23b formed to the other end thereof.

A support shaft or pin 25 is inserted into the shaft hole 23c so that the link member 23 is provided for the socket body 13 to be pivotal around the support shaft 25. A first shaft or pin 24 provided for the operation member 14 is idly fitted into the slot 23a, and a second shaft or pin 26 formed to the support member 27 is inserted into the hole 23b.

Figure 9:
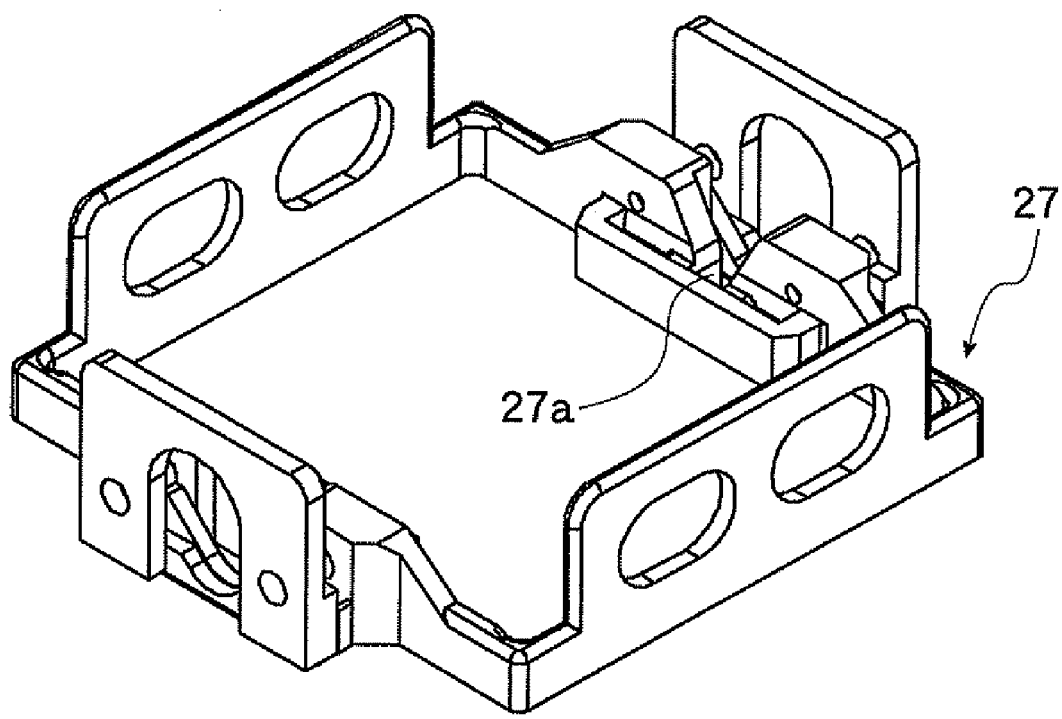
FIG. 9 is a perspective view of a support member according to the present embodiment.
Figure 10:
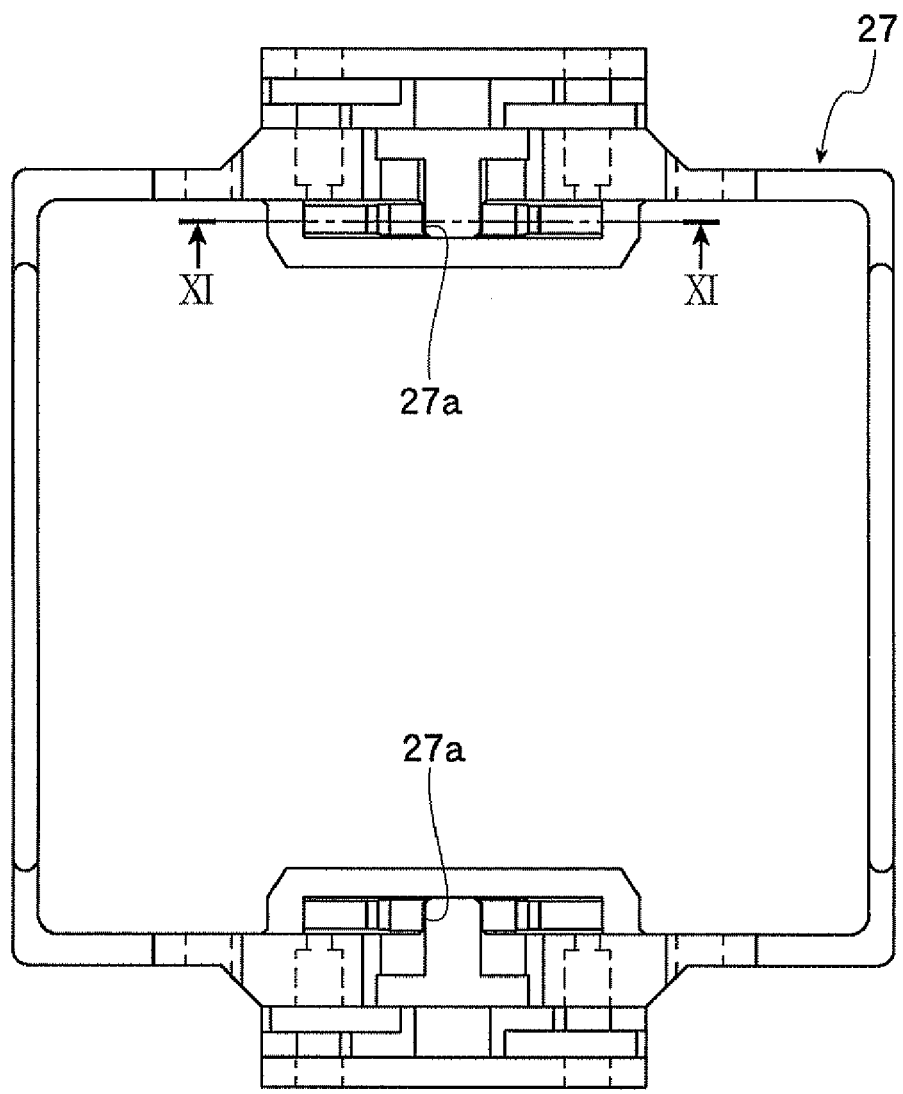
FIG. 10 is a plan view of the support member of FIG. 9.
Figure 11:
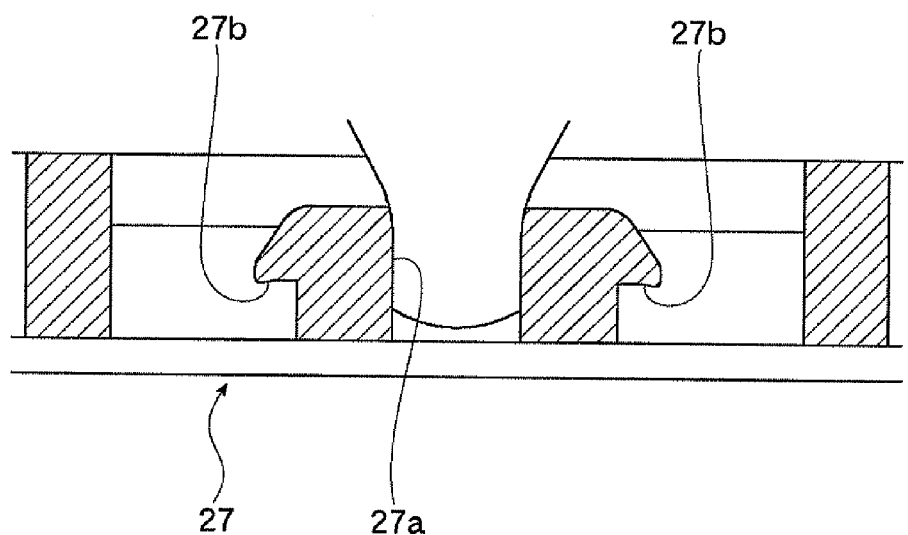
FIG. 11 is a sectional view taken along the line XI-XI in FIG. 10.

The support member 27 has, as shown in FIGS. 9 to 11, a rectangular frame shape and is disposed to be vertically movable around the floating plate 19. The support member 27 is also formed with an insertion hole 27d into which the second shaft 26 is inserted, and when the operation member 14 is moved downward, the support member 27 is moved upward by means of the link members 23.

The support member 27 is provided with a pair of hinged pressing members 15 to be opened outward.

That is, each of the pressing members 15 has, as shown in FIGS. 4, 5, 15 and 16, substantially plate shape and includes a pressing surface portion 15a pressing an upper surface of the IC package 12 and a base end portion 15b projecting downward from one end portion of the pressing surface portion 15a. Further, as shown in FIGS. 22 to 25, the base end portion 15b is disposed to the support member 27 to be pivotal by a rotating shaft or pin 28 so as to be rotated in its opening or closing direction in accordance with the vertical movement of the operation member 14.

The pressing members 15 are moved to be opened or closed by four operating portions 14c formed to the operation member 14 such as shown in FIG. 14, for example. That is, these operating portions 14c are arranged such that a first protruded portion 14d as a "first operating portion" having downwardly protruded semi-circular shape and a second protruded portion 14e as a "second operating portion" having upwardly protruded semi-circular shape are arranged adjacently side by side (see FIGS. 26 to 33).

Furthermore, on the base end (15b) side of the pressing member 15, there is provided an operated portion 15c subjected to operating force by the operating portion 14c. This operated portion 15c is formed with a first recessed portion 15d as a "first operated portion" pressed in engagement with the first protruded portion 14d of the operating portion 14c and a second recessed portion 15e as a "second operated portion" pressed in engagement with the second protruded portion 14e of the operating portion 14c.

Figure 30:
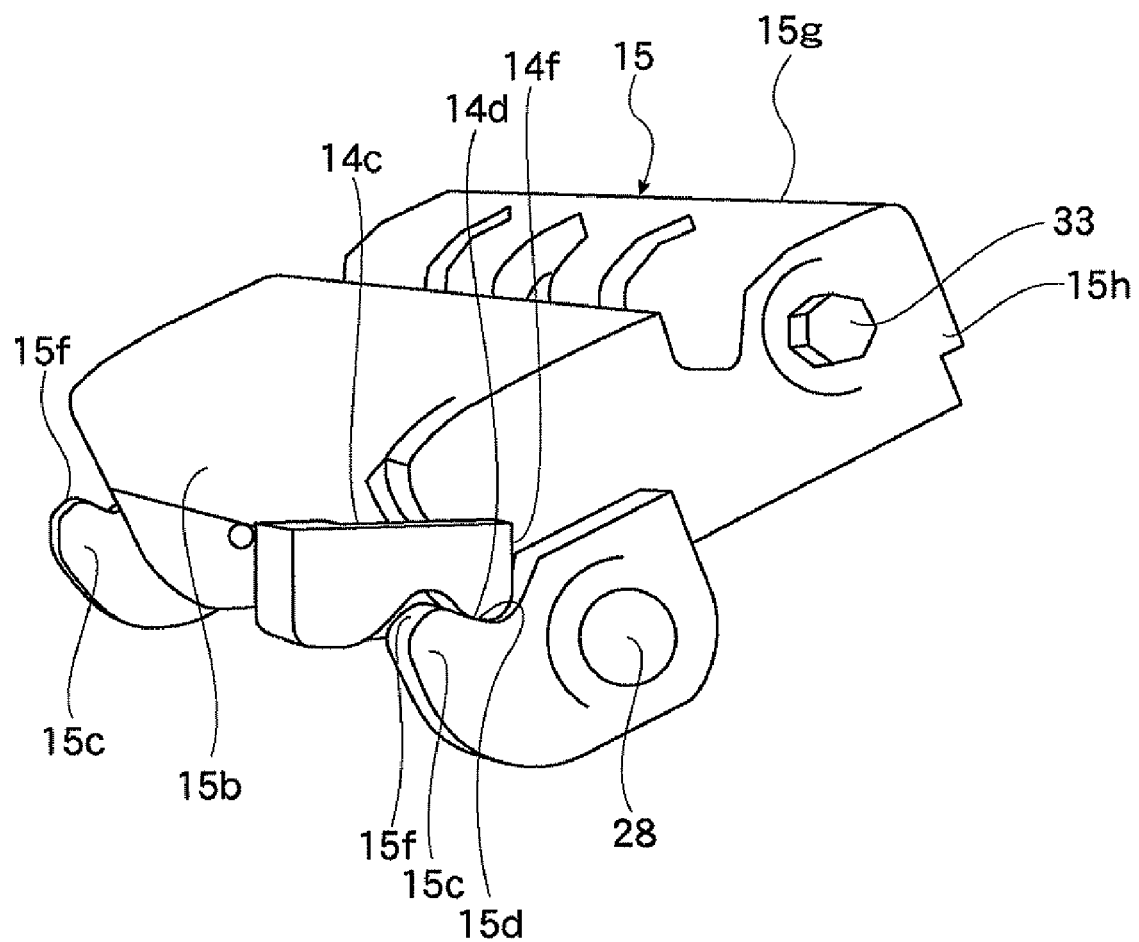
FIG. 30 is a perspective view showing a relationship between the pressing member and the operating portion of the operation member, in which the pressing member is rotated to an oblique position.
Figure 31:
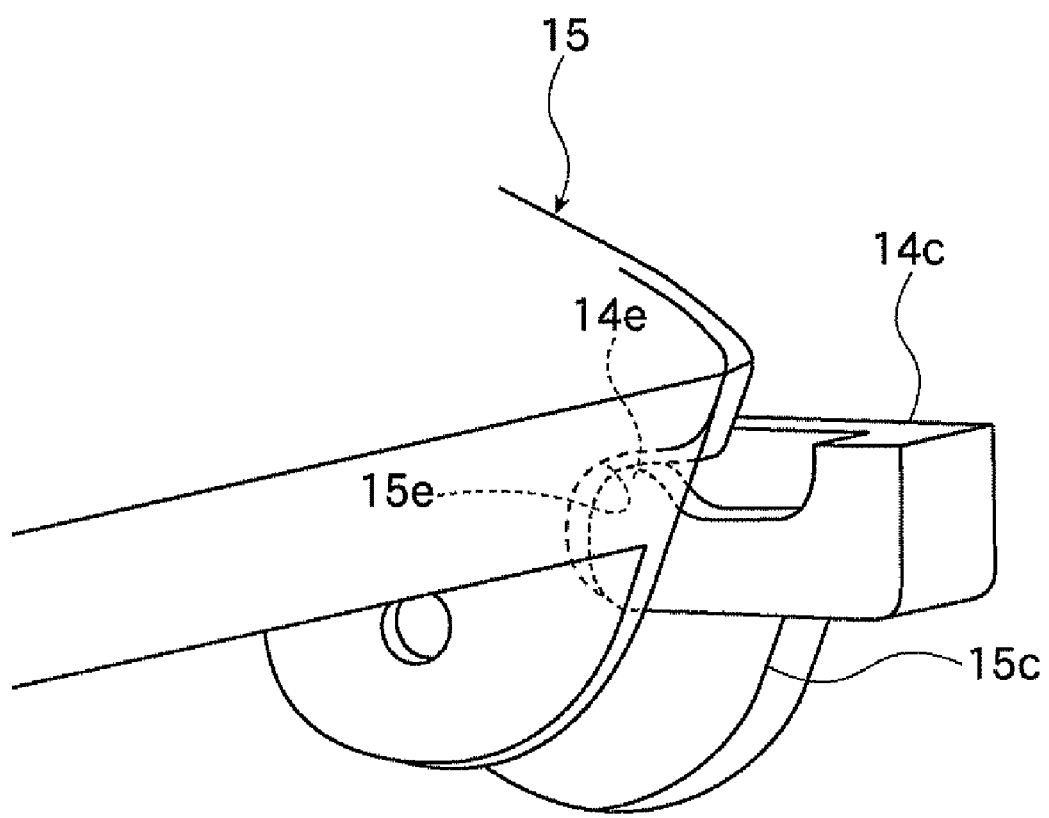
FIG. 31 is a perspective view of the operated portion of the pressing member seen from the inside thereof at a position corresponding to that shown in FIG. 30.
Figure 32:
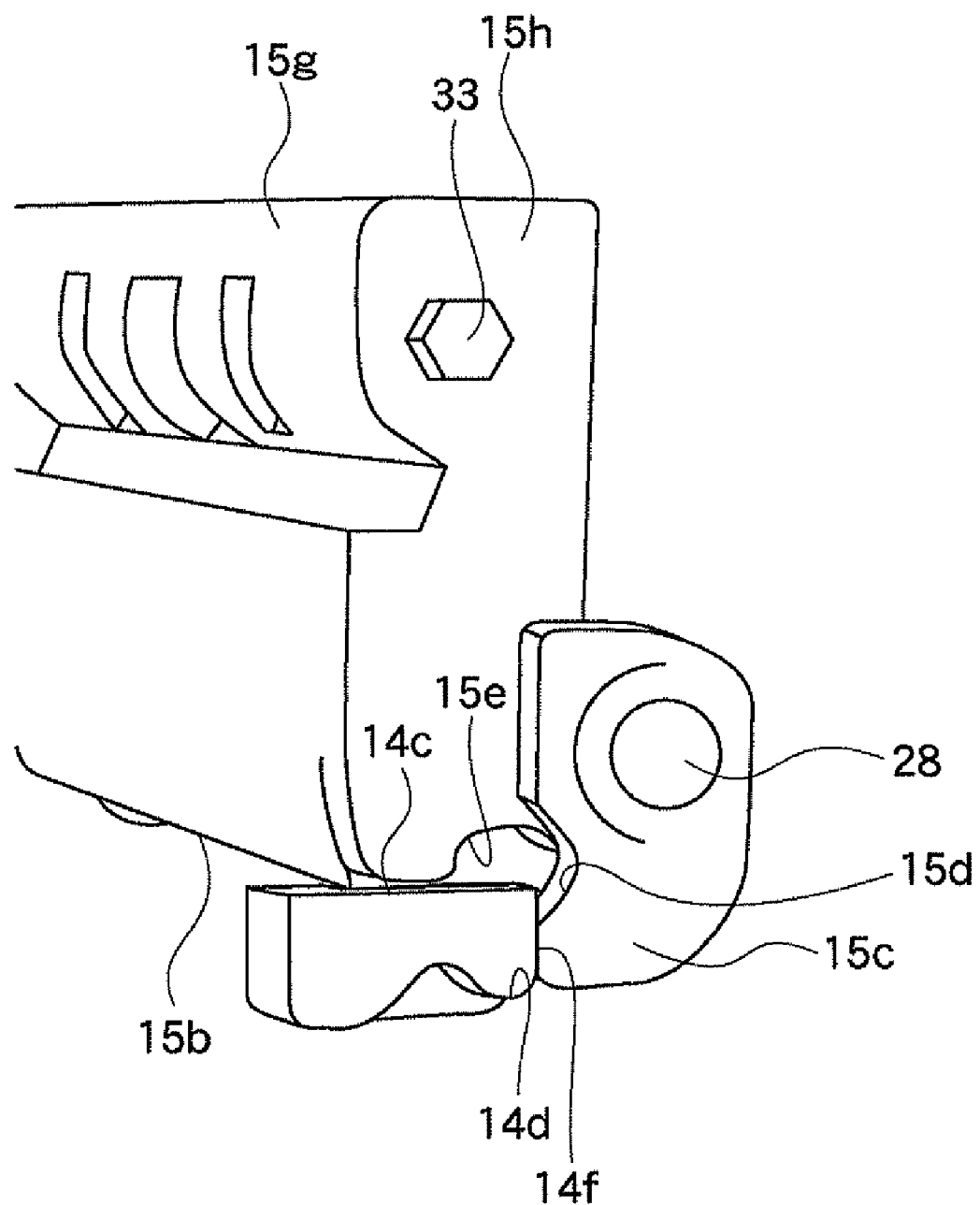
FIG. 32 is a perspective view showing a relationship between the pressing member and the operating portion of the operation member, in which the pressing member is rotated to its standing position.
Figure 33:
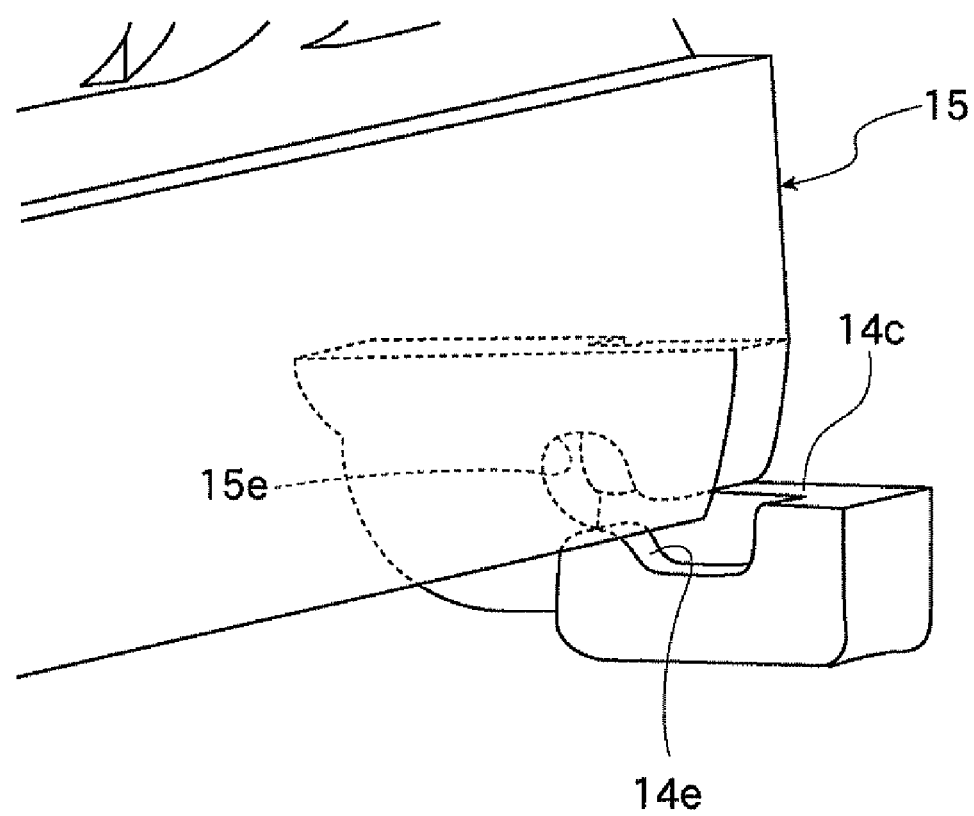
FIG. 33 is a perspective view of the operated portion of the pressing member seen from the inside thereof at a position corresponding to that shown in FIG. 32.

When the operation member 14 is moved downward, as shown in FIGS. 30 and 31, the first protruded portion 14d of the operating portion 14c abuts against the first recessed portion 15d of the pressing member 15, and both are slid along the curved surfaces with each other so that the pressing member 15 is rotated in the opening direction. Then, in the state that the pressing member 15 stands upward as shown in FIGS. 32 and 33, a front end surface 14f of the operating portion 14c abuts against a stopper portion 15f of the operated portion 15c of the pressing member 15 in a manner of maintaining the standing attitude.

On the other hand, when the operation member 14 is moved upward, as shown in FIG. 31, the second protruded portion 14e of the operating portion 14c abuts against the second recessed portion 15e of the pressing member 15 and both are slid along the curved surfaces with each other so that the pressing member 15 is rotated in the closing direction. Then, when the pressing member 15 is inclined from the standing attitude, the first protruded portion 14d abuts against the first recessed portion 15d so that the pressing member 15 is rotated in the closing direction in association with the upward movement of the operation member 14 without rapidly falling down.

Figure 17:
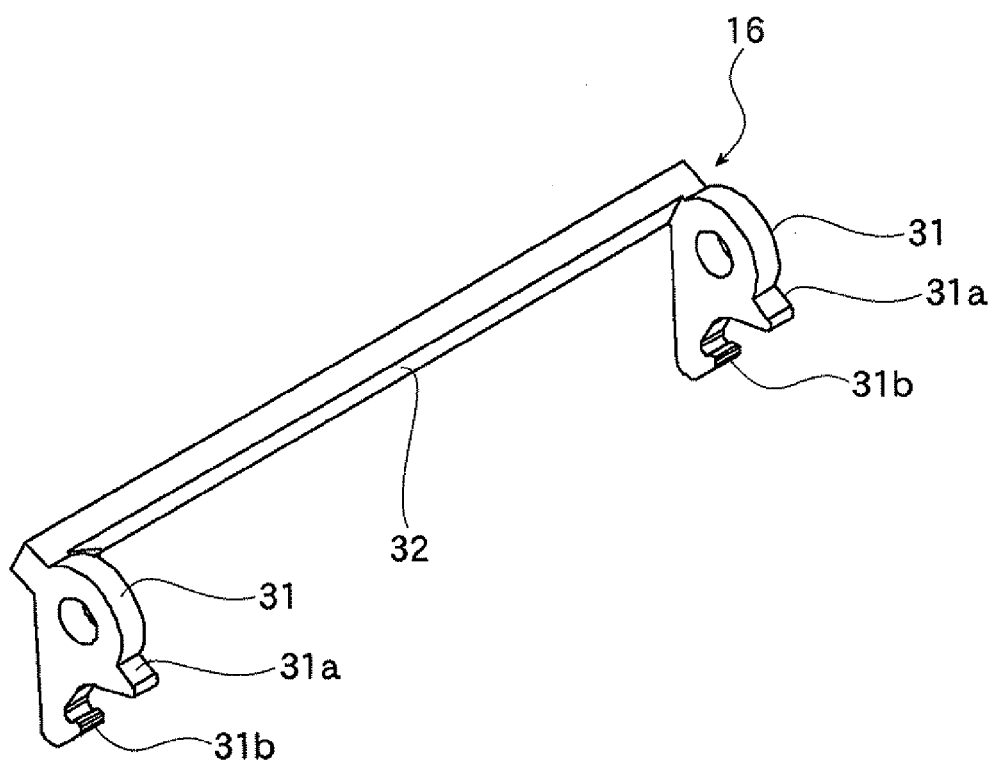
FIG. 17 is a perspective view showing a latch member according to the present embodiment.
Figure 18:
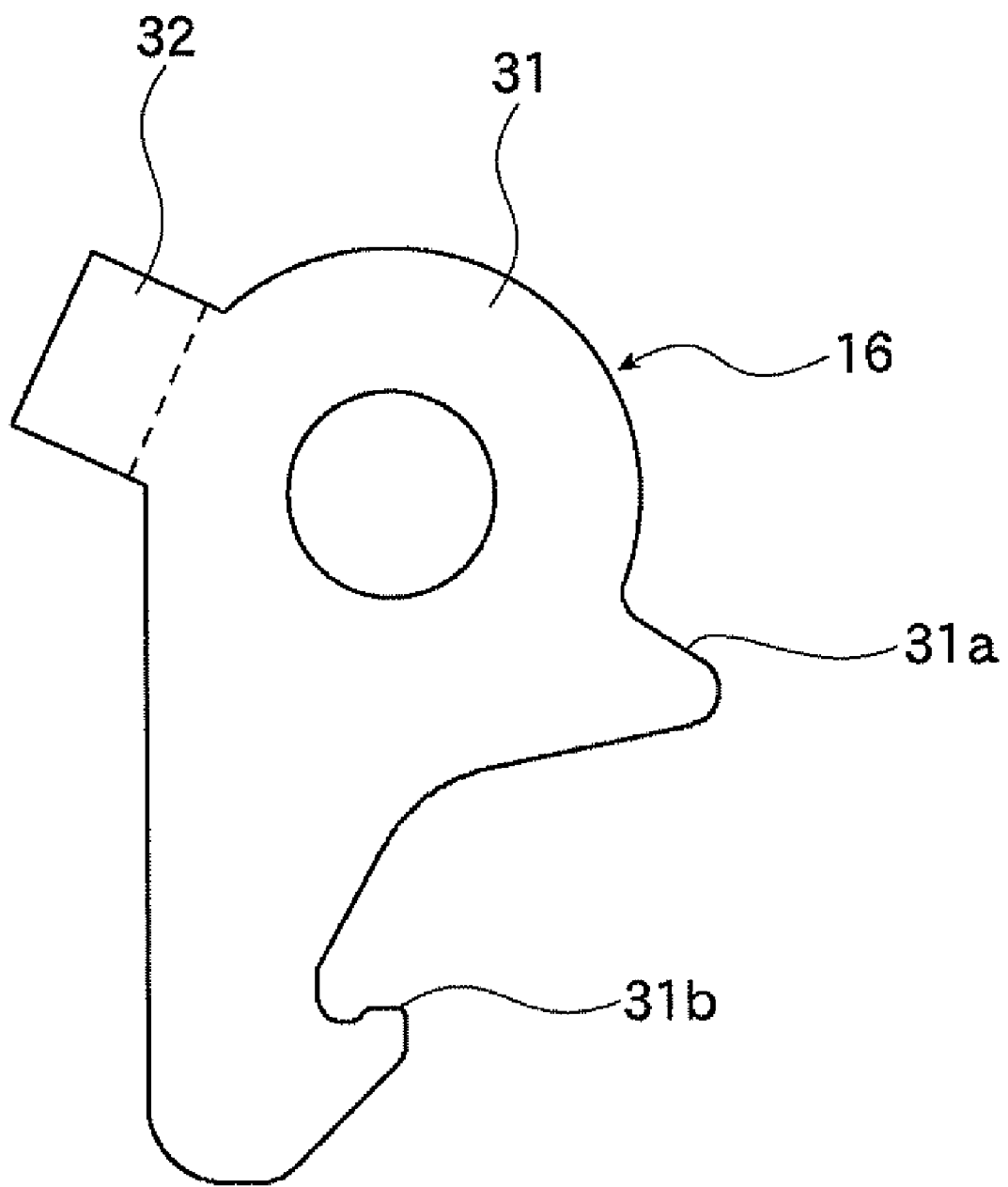
FIG. 18 is a front view showing a latch piece of the latch member of FIG. 17.

In addition, the pressing member 15 is provided, at its front end portion 15g, with a latch member 30, and this latch member 30 is engaged with the support member 27 at a position where the pressing member 15 has substantially horizontal position. The latch member 16 is, as shown in FIGS. 17 and 18, provided with a pair of latch pieces 31 which are connected by a connection piece 32. These latch pieces 31 are positioned at both end portion (15h) sides of the front end (15g) side of the pressing member 15 having substantially rectangular plate shape.

These latch pieces 31 are, as shown in FIGS. 4, 5 and 22 to 25, attached to the side surfaces of both end portions 15h of the pressing member 15 to be rotatable through a latch shaft or pin 33. Each of the latch pieces 31 is formed with a pressed portion 31a and an engaging pawl 31b.

Figure 2:
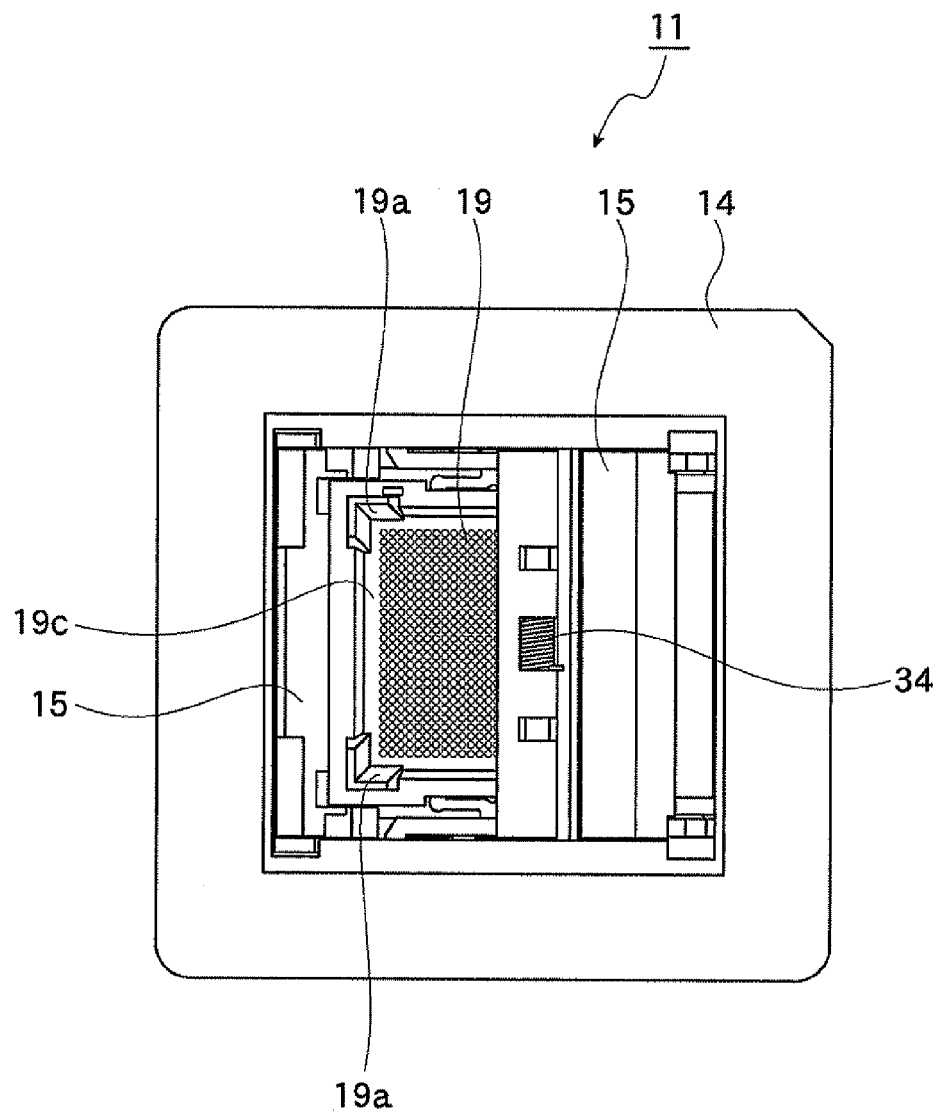
FIG. 2 is a plan view of the IC socket of the present embodiment.
Figure 3:
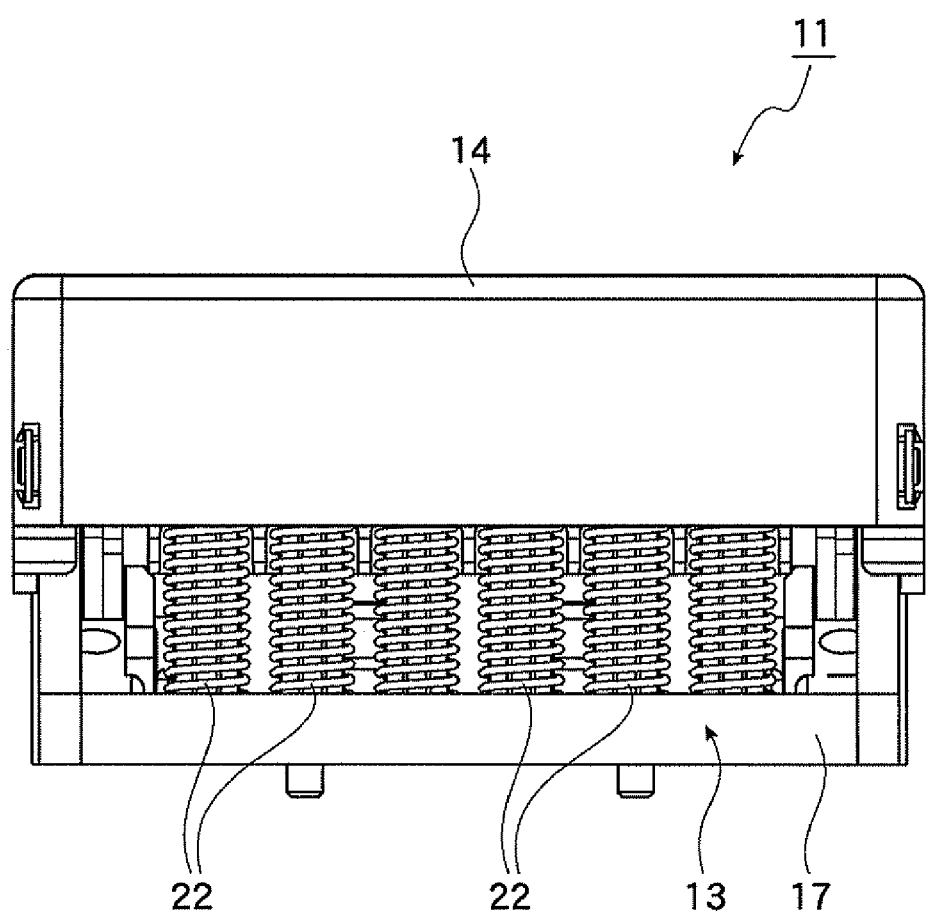
FIG. 3 is a right side view of FIG. 2 according to the present embodiment.

The engaging pawl 31b has, as shown in FIGS. 22 to 25, a structure capable of being engaged with or disengaged from an engaged portion 27b formed to the support member 27, and the latch member 16 is urged by a spring 34 shown in FIG. 2 or 4 in its engaging direction. When the pressing member 15 takes its horizontal attitude, the engaging pawl 31b of the latch piece 31 is engaged with the engaged portion 27b.

Figure 23:
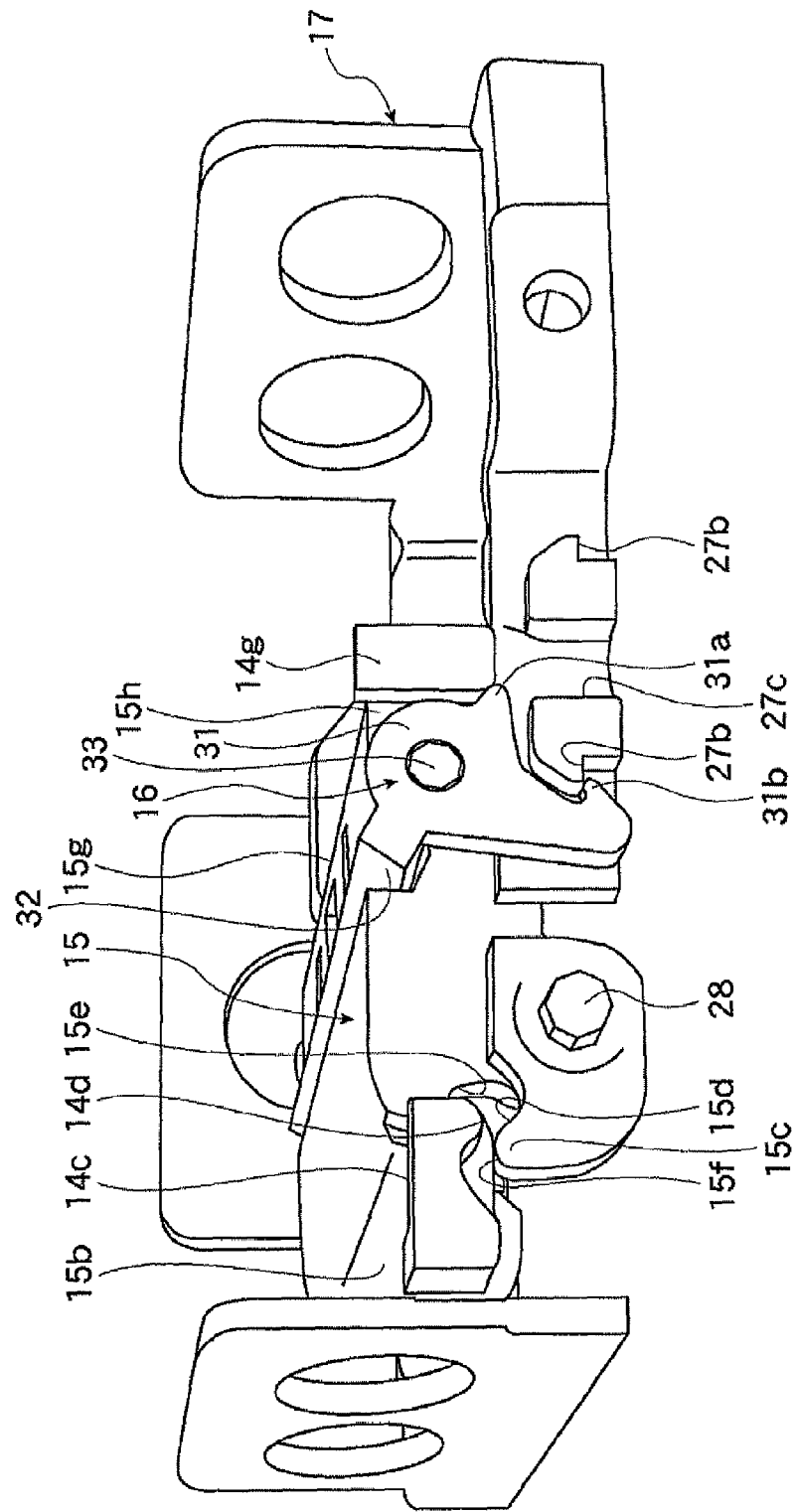
FIG. 23 is a perspective view showing the movement of the pressing member and the latch member in a state in which the latch member is released from engagement.

Furthermore, the pressed portion 31a has, as shown in FIG. 23, a structure being pressed against an engagement releasing member 14g formed to the operation member 14. In a state in which the engaging pawl 31b of the latch piece 31 is engaged with the engaged portion 27b of the support member 27, when the operation member 14 is moved downward, the engagement releasing member 14g formed to the operation member 14 pushes the pressed portion 31a to thereby rotate the latch member 16, whereby the engaging condition of the latch member 16 to the support member 27 is released.

Figure 24:
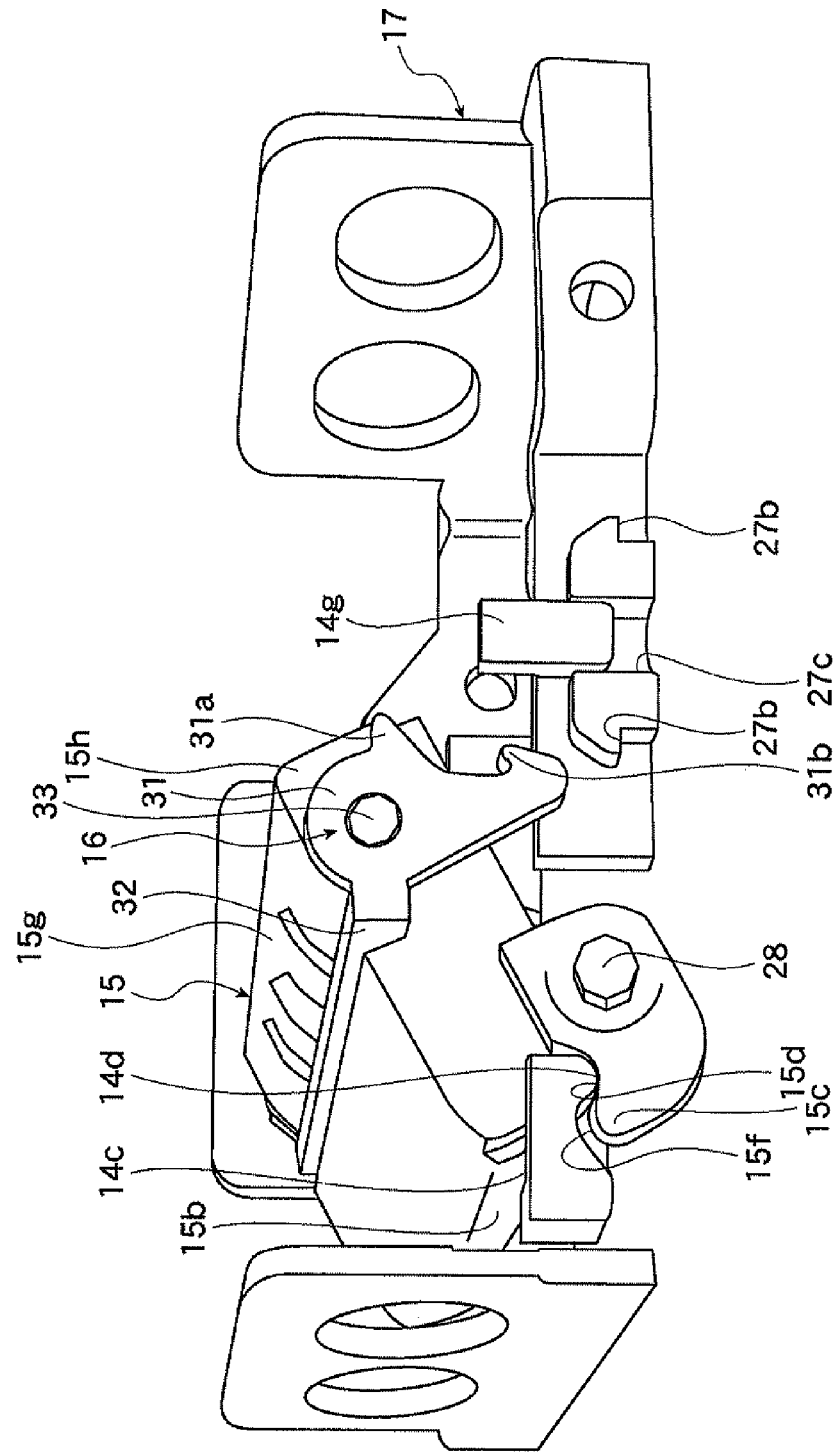
FIG. 24 is a perspective view showing the movement of the pressing member and the latch member in a state in which the pressing member takes its oblique position.

The engagement releasing member 14g is inserted into and guided by a guide groove 27c formed to the support member 27 in a state that the operation member 14 is moved downward to a predetermined position (see FIG. 24)

The IC socket 11 of the structures mentioned above will operate in a manner mentioned hereunder.

First, the IC socket 11 is preliminarily mounted to the printed circuit board. The lower side plunger 20b of the contact pin 20 is contacted, under pressure, to a contact portion of the printed circuit board (not shown) so as to fix it thereto, and in this manner, a plurality of IC sockets 11 are arranged on the printed circuit board.

The IC package 12 is set so as to be electrically connected to the IC socket 11 by means of an automatic machine, for example.

That is, the operation member 14 is pressed downward from the state shown in FIG. 4 to the state shown in FIG. 5 by the automatic machine with the IC package 12 being maintained. In the state shown in FIG. 4, the operation member 14 takes its upper limit position under the urging force of the spring 22.

Herein, when the operation member 14 is moved downward from the state shown in FIG. 20, one end portion of the side of the slot 23a of the link member 23 is pressed downward, and the link member 23 is rotated around the support shaft 25 fixed to the socket body 13 as shown in FIG. 21.

According to this motion, the other end portion of the slot (23b) side of the link member 23 is displaced upward, and the support member 27 connected by means of the second shaft 26 is parallelly moved upward.

When the operation member 14 is lowered, the engagement releasing member 14g for releasing the engaging condition of the latch member 16 and the operating portion 14c for rotating the pressing member 15 are also lowered.

Figure 25:
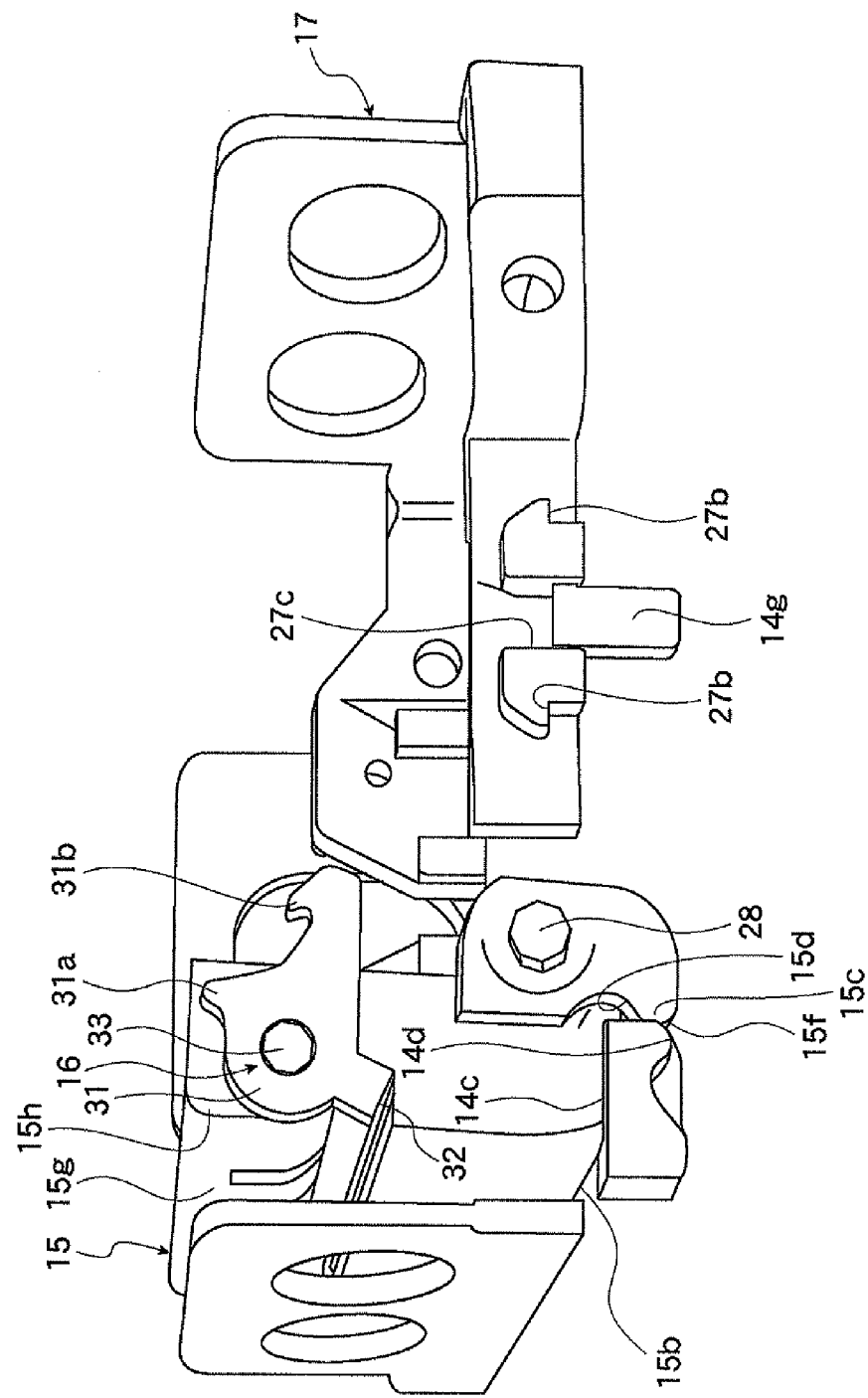
FIG. 25 is a perspective view showing the movement of the pressing member and the latch member in a state in which the pressing member stands up and takes in an opened position.
Figure 26:
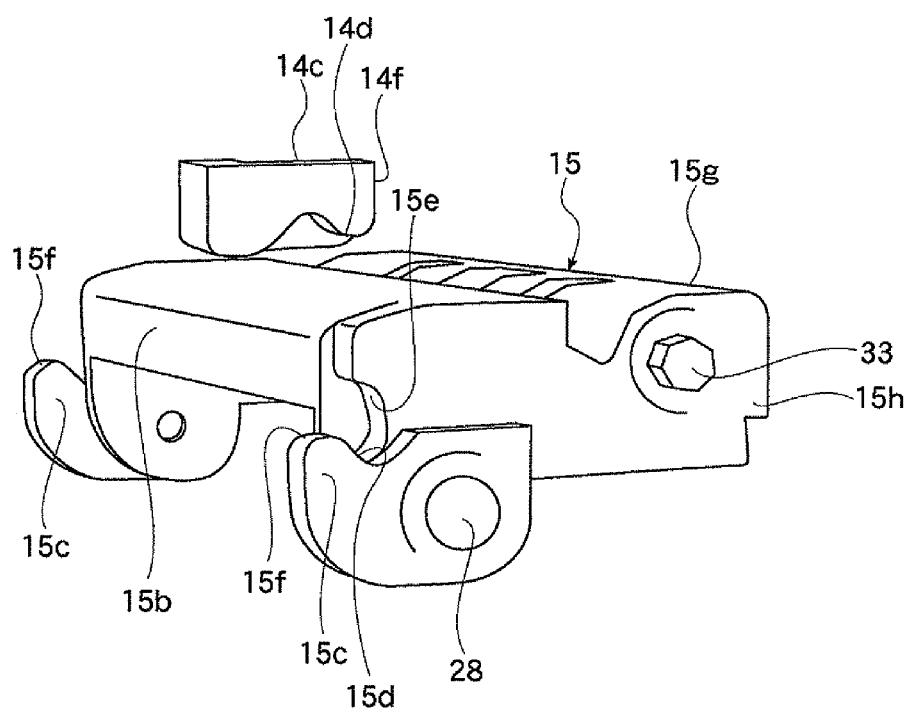
FIG. 26 is a perspective view showing a relationship between the pressing member and the operation member in which the pressing member takes its closed position.
Figure 27:
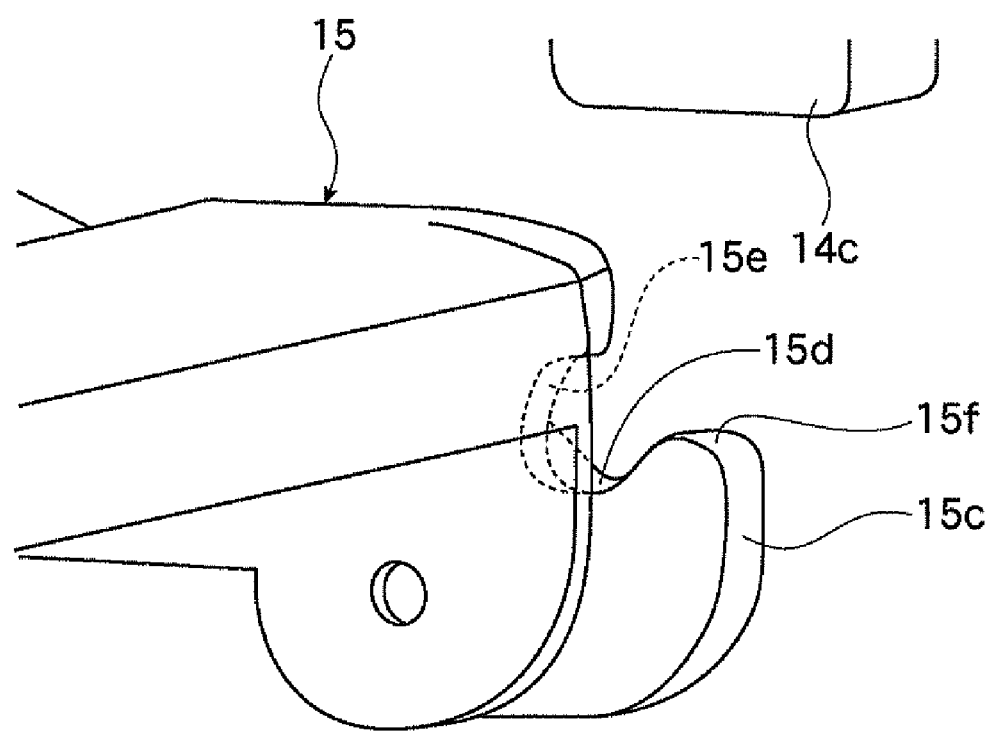
FIG. 27 is a perspective view of an operated portion of the pressing member seen from the inside thereof in a position corresponding to that shown in FIG. 26.
Figure 28:
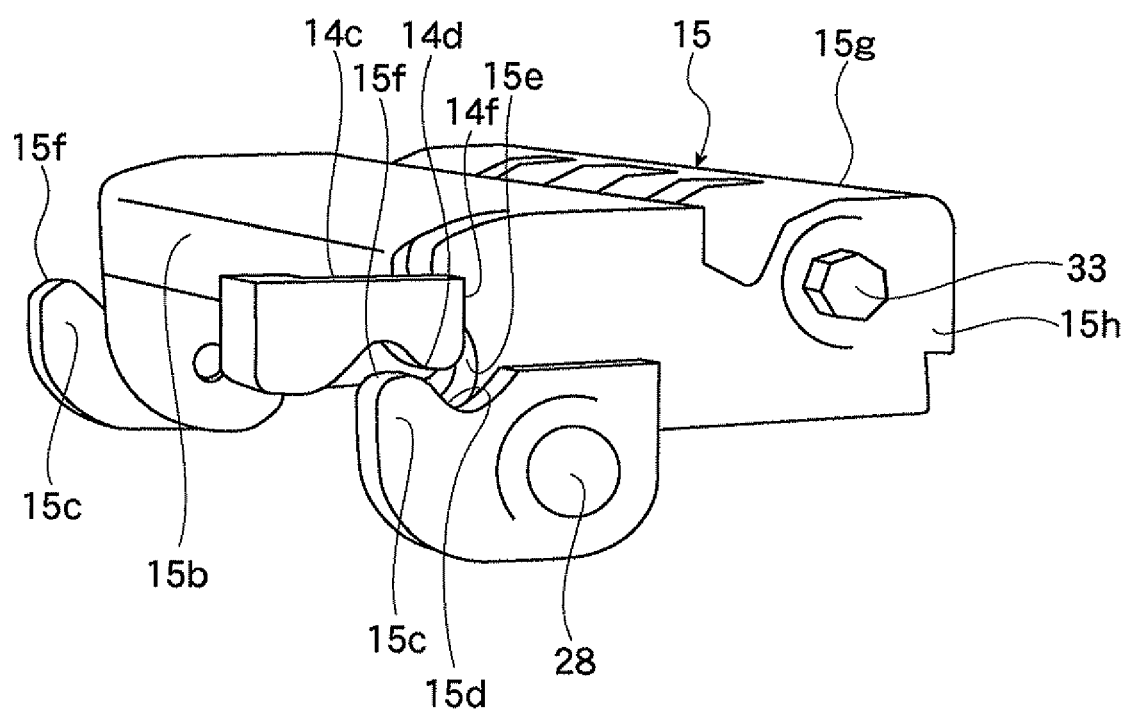
FIG. 28 is a perspective view showing a relationship between the pressing member and the operating portion of the operation member, in which the operating portion of the operation member approaches the operated portion of the pressing member when the pressing member is closed.
Figure 29:
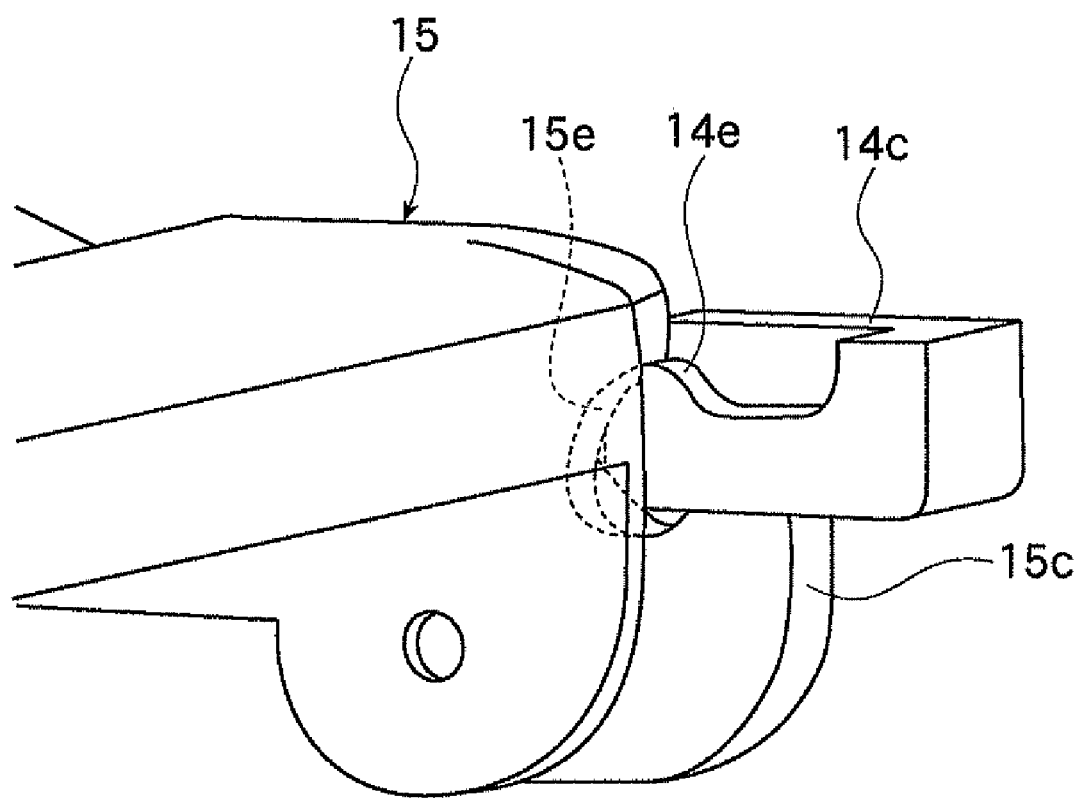
FIG. 29 is a perspective view of the operated portion of the pressing member seen from the inside thereof at the position corresponding to that shown in FIG. 28.

When the engagement releasing member 14g is lowered, the engagement releasing member 14g abuts against the pressed portion 31a of the latch piece 31, and rotates the latch piece 31 against the urging force of the spring 34 in the clockwise direction in FIG. 23 with the latch shaft 33 being the center of the rotation. According to this motion, the engaging pawl 31b of the latch piece 31 is separated from the engaged portion 27b of the support member 27 to thereby release the engaging condition, and the engagement releasing member 14g is further lowered as shown in FIGS. 24 and 25. Thus the engagement releasing member 14g is guided by the guide groove 27c and the support member 27 is moved upward by being guided by the engagement releasing member 14g.

In association with the above motion, when the operating portion 14c is lowered, the engaging state of the latch piece 31 is released. Thereafter, the first recessed portion 15d of the operated portion 15c of the pressing member 15 is pressed downward by the first protruded portion 14d of the operating portion 14c, and thereby, the pressing member 15 is rotated upward around the rotation shaft 28, as shown in FIGS. 30 to 33, from the state shown in FIGS. 28 and 29. Furthermore, as shown in FIGS. 32 and 33, in the standing state of the pressing member 15, the front end surface 14f of the operating portion 14c abuts against the stopper portion 15f of the operated portion 15c of the pressing member 15 to thereby maintain the standing position thereof.

In the state mentioned above, the IC package 12 is released from the automatic machine, and is mounted on the accommodation portion 19c of the floating plate 19 of the socket body 13. In this state, the IC package 12 is guided to the predetermined position by the guide portions 19a of the floating plate 19, and the terminals 12b of the IC package 12 are surely contacted to the upper side plungers 20a of the contact pins 20, respectively.

Thereafter, when the pressing force of the operation member 14 by the automatic machine is released, the operation member 14 is moved upward from the position shown in FIG. 5 by the urging force of the spring 22, and in accordance with the upward movement, the operating portion 14c of the operation member 14 is moved upward from the position shown in FIG. 33. Then, when the operating portion 14c is further moved upward, the second protruded portion 14e of the operating portion 14c abuts against the second recessed portion 15e of the pressing member 15, and the operating portion 14c is moved further upward. Then, as shown in FIGS. 30 and 31, the pressing member 15 is rotated in its closing direction around the rotation shaft 28.

When the pressing member 15 takes its horizontal attitude, the engaging pawl 31b of the latch piece 31 is moved across the engaged portion 27b of the support member 27 and engaged therewith by the urging force of the spring 34.

Figure 19A:
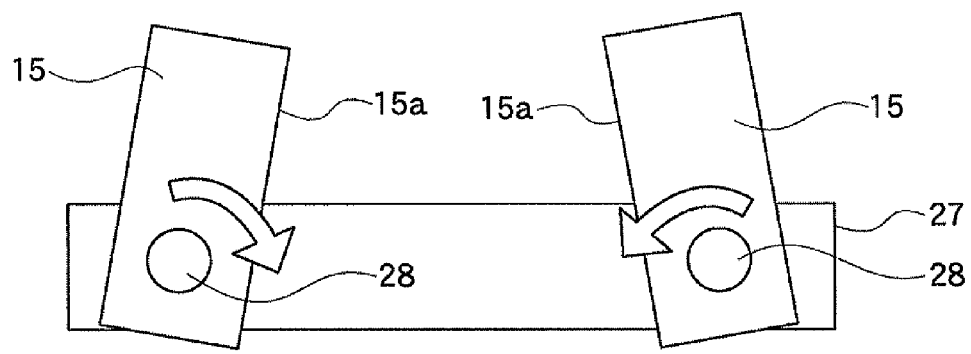
FIGS. 19A and 19B are schematic views showing motion of the IC socket according to the present embodiment.
Figure 19B:
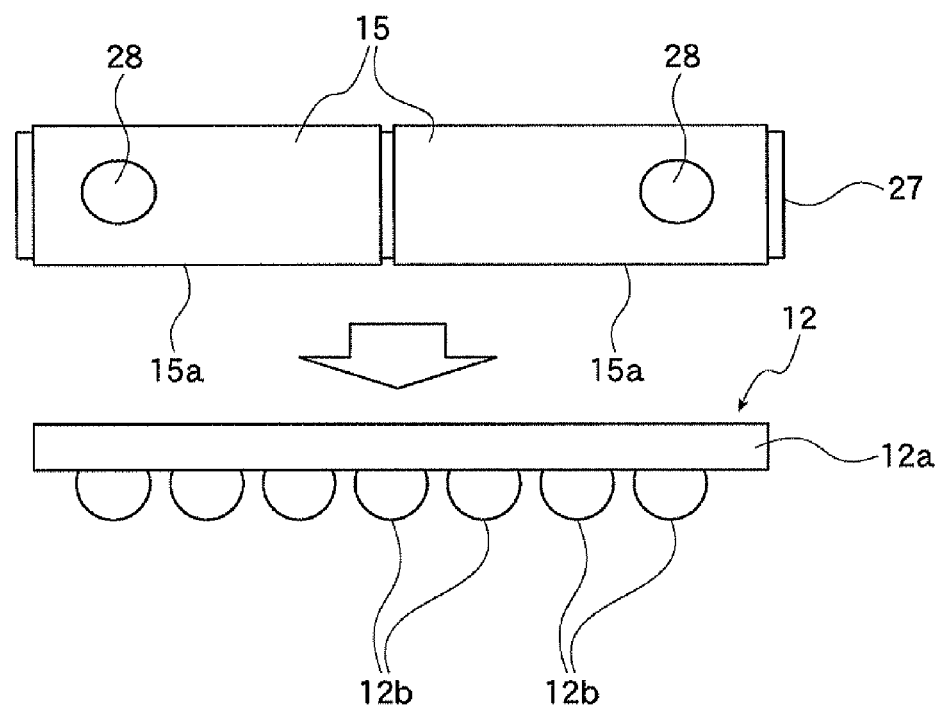

From this state, when the operation member 14 is further moved up, the support member 27 is lowered through the link member 23, so that the pressing surface portion 15a of the pressing member 15 is parallelly moved downward as shown with an arrow from the horizontal state shown in FIG. 19B.

Then, the pressing surface portion 15a of the pressing member 15 abuts against the upper surface of the IC package 12 so as to press the upper surface downward at a predetermined pressing force. By parallelly moving downward the pressing surface portion 15a of the pressing member 15, the upper surface of the IC package 12 is uniformly pressed downward. Thus, the floating plate 19 is lowered against the urging force of the spring, and then, each terminal 12b of the IC package 12 abuts against the upper side plunger 20a of each contact pin 20 at a predetermined contacting force to thereby establish electrical conduction therebetween. Under this condition, the burn-in test is carried out.

In the IC socket of the structure mentioned above, the latch member 16 is provided for the pressing member 15 to be rotatable, and the engagement releasing member 14g for releasing the engagement of the latch member 16 is formed to the operation member 14. According to such simple structure, the mechanism for engaging the pressing member in its closed state can be constituted.

In addition, the engagement releasing member 14g can simultaneously release the engagement of the paired latch members of the pressing member 15 formed on both sides thereof, so that the disengagement of the latch members can be done with the simple structure.

Furthermore, by fixing the front end portion of the pressing surface portion 15a of the pressing member 15 to the support member 27, even if the pressing surface portion 15a has a large area (i.e., large IC package 12), the front end side of the pressing surface portion 15a does not float, and the upper surface of the IC package 12 can be uniformly pressed.

Still furthermore, in the latch member 16, the paired latch pieces 31 are connected through the connection portion 32, and the latch pieces 31 are disposed on both the end sides of the pressing member 15, and accordingly, the latch pieces 31 can be surely engaged on both the end portions of the pressing member 15. In addition, since the paired latch pieces 31 are connected through the connection portion 32, the number of parts can be eliminated and the arrangement can be easily performed.

Still furthermore, since the support member 27, to which the front end portion of the pressing surface portion 15a of the pressing member 15 is fixed by means of latch members 16, is moved parallelly downward, the upper surface of the IC package 12 can be pressed with the extremely accurate horizontal level being maintained.

It is further noted that although, in the above embodiment, the present invention is applied to the IC socket as the "socket for electrical parts", the present invention is not limited thereto and is applicable to the other devices or like.

Furthermore, a pair of latch pieces 31 are connected through the connection portion 32, but both the latch pieces 31 may be independently disposed to be rotatable.

That is, the present invention is not limited to the described embodiments and many other changes and modifications may be made without departing from the scopes of the appended claims.

What is claimed is:

1. A socket for an electrical part comprising:
   a socket body accommodating an electrical part;
   an electrically conductive member disposed to the socket body and configured to contact to a terminal of the electrical part so as to establish an electric conduction therebetween;
   a pressing member mounted to the socket body to be rotatable and configured to press the electrical part in a horizontal position thereof;
   an operation member provided for the socket body to be vertically movable and configured to rotate the pressing member; and
   a latch member provided for the pressing member to be rotatable and having an engaging portion to be engaged with the socket body in the horizontal state of the pressing member,
   the latch member being provided with a pressed portion, and when the operation member is moved downward in a state that the latch member is engaged with the socket body, and an engagement releasing member formed to the operation member presses the pressed portion to rotate the latch member so as to release the engagement of the latch member with the socket body.

2. The socket for an electrical part according to claim 1, wherein a pair of pressing members are disposed so as to be opened outward, the pressing member has a base end side which is provided for the socket body to be rotatable around a rotation shaft, and the latch member is mounted to a front end of the pressing member to be rotatable.

3. The socket for an electrical part according to claim 2, wherein the socket body is provided with a support member to be vertically movable, the pressing member is mounted to the support member to be rotatable, the support member is connected to the operation member through a link member so that when the operation member is moved downward, the support member is moved upward through an operation of the link member and the engagement of the latch member is released by the engagement releasing member to thereby rotate the pressing member to be opened, and when the operation member is moved upward, the pressing member is rotated to be closed in a horizontal state, the latch member is engaged with the support member, the support member being moved downward through the link member so that the pressing member is moved downward parallelly to press the electrical part.

4. The socket for an electrical part according to claim 1, wherein the socket body is provided with a support member to be vertically movable, the pressing member is mounted to the support member to be rotatable, the support member is connected to the operation member through a link member so that when the operation member is moved downward, the support member is moved upward through an operation of the link member and the engagement of the latch member is released by the engagement releasing member to thereby rotate the pressing member to be opened, and when the operation member is moved upward, the pressing member is rotated to be closed in a horizontal state, the latch member is engaged with the support member, the support member being moved downward through the link member so that the pressing member is moved downward parallelly to press the electrical part.

5. The socket for an electrical part according to claim 1, wherein the latch member includes a pair of latch pieces connected with each other through a connection portion, each of the latch pieces is formed with the pressed portion and the engaging portion, the pressing member has a substantially rectangular shape, and the latch pieces are disposed on both end side portions of the front end side of the pressing member.

6. The socket for an electrical part according to claim 1, wherein a socket is an IC socket and the electrical part is an IC package.

* * * * *